(12) United States Patent
Lin et al.

(10) Patent No.: US 11,569,084 B2
(45) Date of Patent: Jan. 31, 2023

(54) METHOD FOR MANUFACTURING SEMICONDUCTOR STRUCTURE WITH REDUCED NODULE DEFECTS

(71) Applicant: TAIWAN SEMICONDUCTOR MANUFACTURING COMPANY, LTD., Hsinchu (TW)

(72) Inventors: Che-Yu Lin, Hsinchu (TW);
Chih-Chiang Chang, Hsinchu (TW);
Chien-Hung Chen, Hsinchu (TW);
Ming-Hua Yu, Hsinchu (TW);
Tsung-Hsi Yang, Hsinchu (TW);
Ting-Yi Huang, Hsinchu (TW);
Chii-Horng Li, Hsinchu (TW);
Yee-Chia Yeo, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 48 days.

(21) Appl. No.: 17/199,033

(22) Filed: Mar. 11, 2021

(65) Prior Publication Data
US 2022/0293415 A1 Sep. 15, 2022

(51) Int. Cl.
| | |
|---|---|
| H01L 21/02 | (2006.01) |
| H01L 27/092 | (2006.01) |
| H01L 29/08 | (2006.01) |
| H01L 29/45 | (2006.01) |
| H01L 29/78 | (2006.01) |
| H01L 29/66 | (2006.01) |
| H01L 21/8238 | (2006.01) |
| H01L 21/285 | (2006.01) |

(52) U.S. Cl.
CPC .. *H01L 21/02057* (2013.01); *H01L 21/28518* (2013.01); *H01L 21/823814* (2013.01); *H01L 21/823821* (2013.01); *H01L 27/0924* (2013.01); *H01L 29/0847* (2013.01); *H01L 29/45* (2013.01); *H01L 29/66545* (2013.01); *H01L 29/66636* (2013.01); *H01L 29/66795* (2013.01); *H01L 29/7851* (2013.01)

(58) Field of Classification Search
CPC ......... H01L 21/02057; H01L 21/28518; H01L 21/823814; H01L 21/823821; H01L 27/0924; H01L 29/0847; H01L 29/45; H01L 29/66545; H01L 29/66636; H01L 29/66795; H01L 29/7851
See application file for complete search history.

(56) References Cited

U.S. PATENT DOCUMENTS

| | | | |
|---|---|---|---|
| 2020/0044025 A1* | 2/2020 | Liu | H01L 21/76897 |
| 2022/0157604 A1* | 5/2022 | Wu | H01L 21/324 |

* cited by examiner

*Primary Examiner* — Karen Kusumakar
*Assistant Examiner* — Adam S Bowen
(74) *Attorney, Agent, or Firm* — Birch, Stewart, Kolasch & Birch, LLP

(57) ABSTRACT

A method for removing nodule defects is disclosed. The nodule defects may be formed on a non-selected portion of a semiconductor structure during formation of a semiconductor region on a selected portion of the semiconductor structure. A plasma having a higher selectivity to etch the nodule defects relative to the semiconductor region may be used to selectively remove the nodule defects on the non-selected portion.

20 Claims, 36 Drawing Sheets

METHOD FOR MANUFACTURING SEMICONDUCTOR STRUCTURE WITH REDUCED NODULE DEFECTS

BACKGROUND

In a method for manufacturing a semiconductor device, a selective epitaxial growth process may be used for, e.g., re-growing source/drain regions in recesses of an OD region (oxide definition region, i.e., a region where a source, a drain, and a channel of a semiconductor device are formed). However, in such a selective epitaxial growth process, some ball-like particles may undesirably grow on the non-selected regions, such as spacers or other regions including oxides, nitrides, or other dielectric materials. Such ball-like particles may be referred to as nodule defects. Serious nodule defects may block subsequent processes, and may adversely affect yield of the semiconductor device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
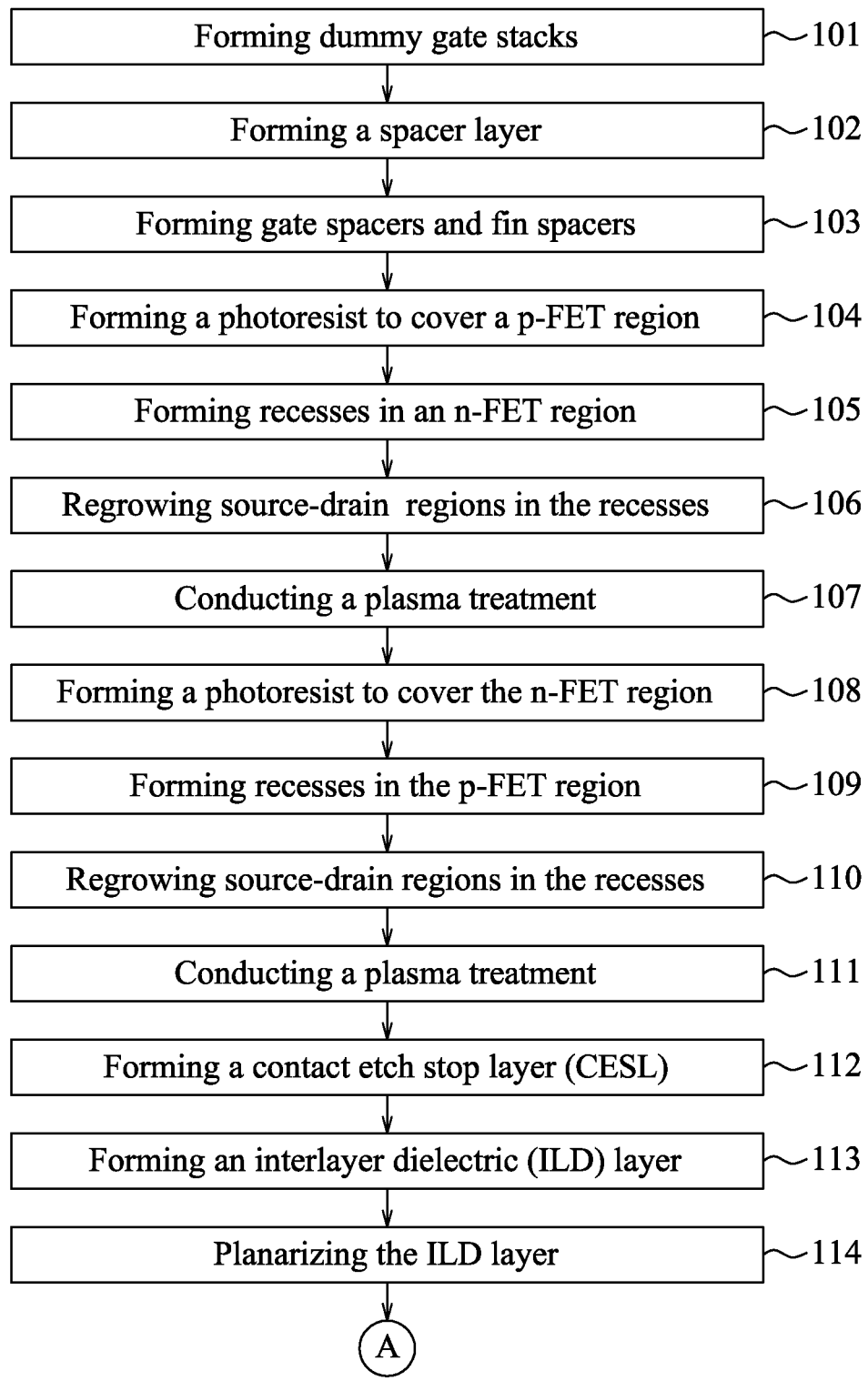
FIGS. 1A and 1B are flow diagrams illustrating a method for manufacturing a semiconductor structure with reduced nodule defects in accordance with some embodiments.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "on," "lower," "higher," "beneath," "over," "proximate," "distal," "outer," "inner," "outermost," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1B:
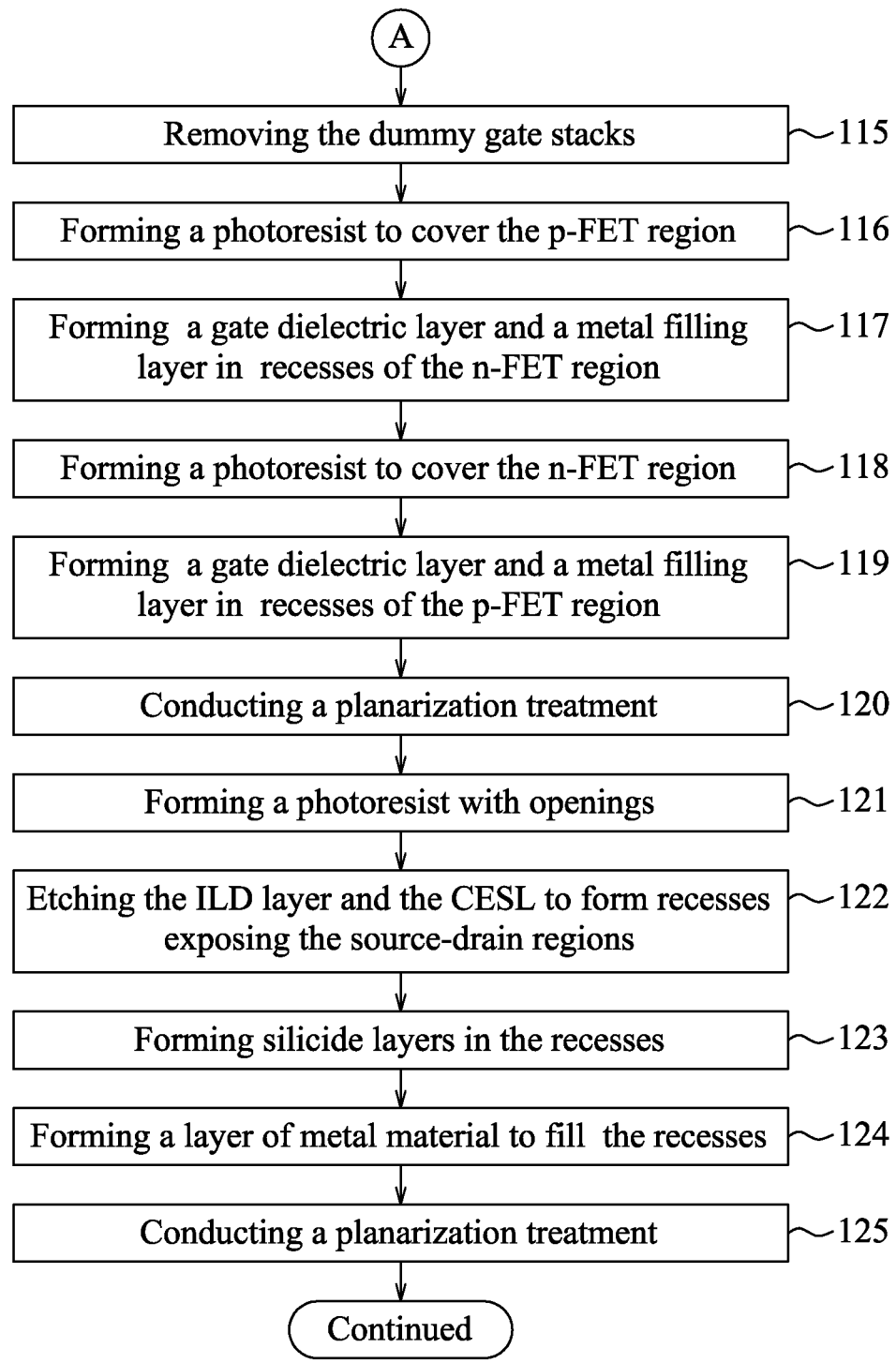

FIGS. 1A and 1B are flow diagrams illustrating a method 100 for manufacturing a semiconductor structure in accordance with some embodiments. FIGS. 2 to 38 illustrate schematic views of the intermediate stages of the method 100.

Figure 2:
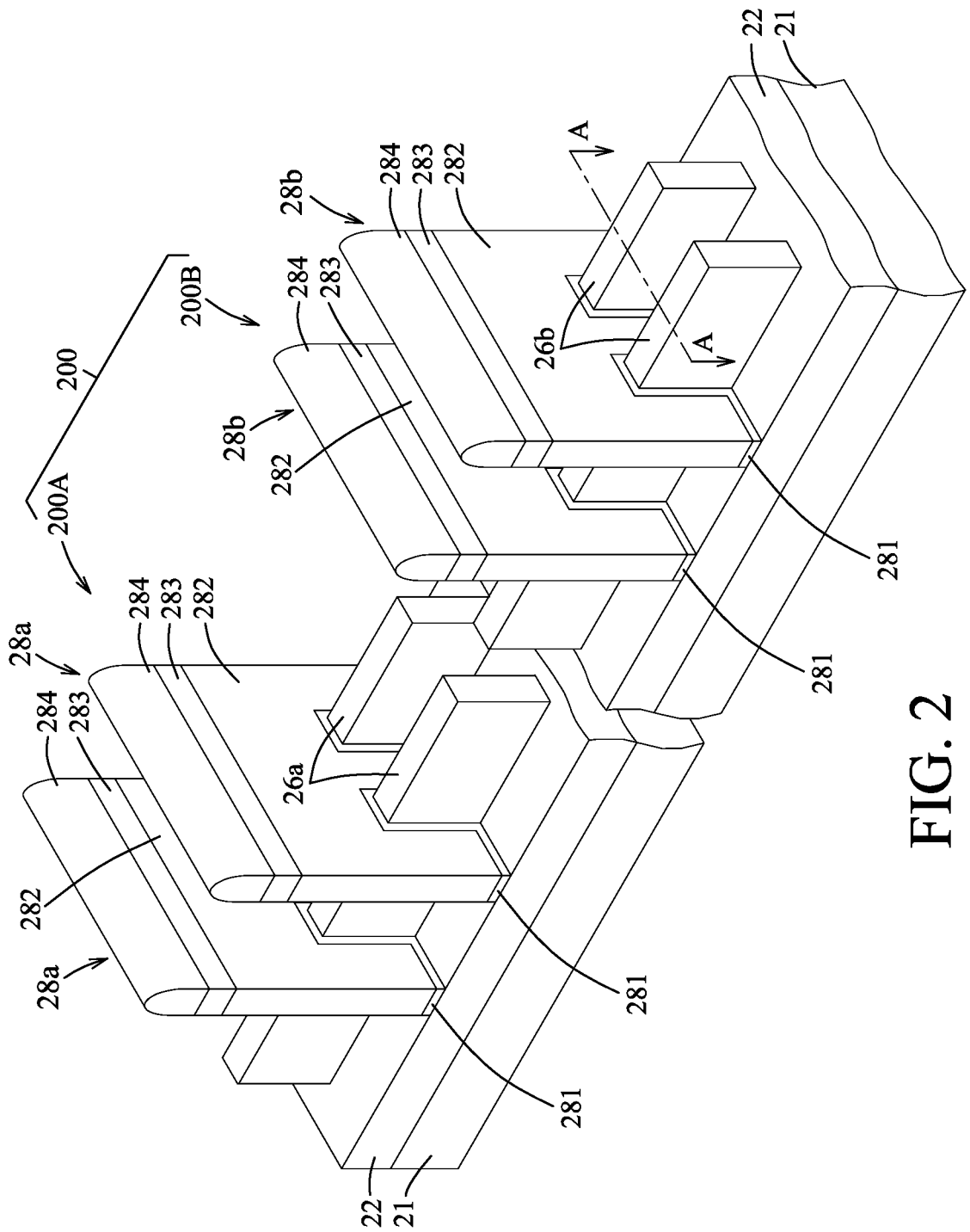
FIGS. 2 to 38 are schematic perspective and cross-sectional views illustrating intermediate stages of the method for manufacturing the semiconductor structure in accordance with some embodiments as depicted in FIGS. 1A and 1B.

Referring to FIGS. 1A and 2, the method 100 begins at step 101, where dummy gate stacks 28a and dummy gate stacks 28b are respectively formed over an n-FET region 200A and a p-FET region 200B of a semiconductor structure 200. The semiconductor structure 200 may be used for forming advanced technology semiconductor devices, for example, but not limited to, fin-type filed effect transistor (FinFET) devices, nano-sheet transistor devices, nano-wire transistor devices, and other suitable devices. Each of the dummy gate stacks 28a, 28b may include a dummy gate dielectric 281, a dummy gate electrode 282, a polish-stop layer 283, and a hard mask layer 284. Each of the dummy gate stacks 28a, 28b may be formed by depositing a layer of gate dielectric material (not shown), a layer of gate electrode material (not shown), a layer of polish-stop material (not shown), and a layer of hard mask material (not shown), followed by a lithography process and an etching process to form the dummy gate dielectric 281, the dummy gate electrode 282, the polish-stop layer 283, and the hard mask layer 284. The gate dielectric material may include, for example, but not limited to, silicon oxide, silicon nitride, silicon oxynitride, high dielectric constant (k) materials, other suitable materials, or combinations thereof. The gate electrode material may include, for example, but not limited to, polycrystalline silicon, single crystalline silicon, amorphous silicon, other suitable materials, or combinations thereof. The polish-stop material may include, for example, but not limited to, silicon nitride (e.g., SiN), silicon oxide, other nitrides, other oxides, other suitable materials, or combinations thereof. The hard mask material may include, for example, but not limited to, silicon nitride, silicon oxide, silicon oxynitride, other suitable materials, or combinations thereof.

Figure 3:
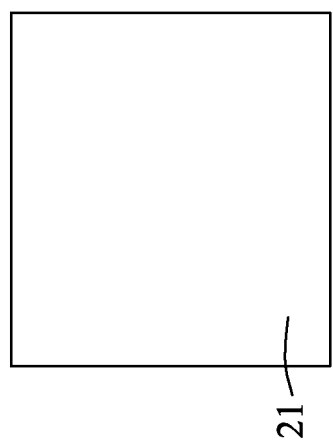

FIGS. 3 to 8 are schematic views illustrating steps for formation of each of the n-FET region 200A and the p-FET region 200B before step 101. FIG. 3 is a schematic view of a semiconductor substrate 21. The semiconductor substrate 21 may be, for example, but not limited to, a part of a wafer, or a silicon substrate, a silicon carbon substrate, or a substrate made of other semiconductor material. The semiconductor substrate 21 may be non-doped or lightly-doped with a p-type or an n-type impurity.

Figure 4:
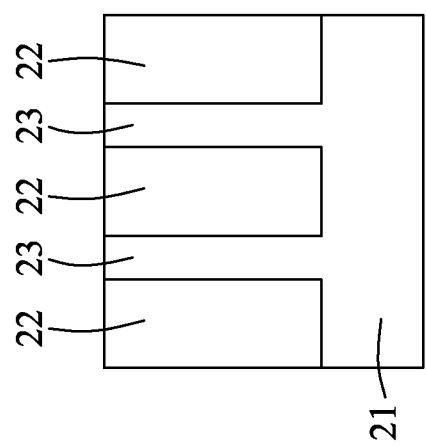

FIG. 4 is a schematic view illustrating that isolation regions 22 are formed in the semiconductor substrate 21, and semiconductor strips 23 are defined among the isolation regions 22. The isolation regions 22 may be shallow trench isolation (STI) regions, and may be formed by etching the semiconductor substrate 21 to form a plurality of trenches (not shown), and filling the trenches with a dielectric material to form the STI regions 22. The dielectric material for forming the STI regions 22 may include, for example, but not limited to, silicon oxide, silicon nitride, silicon oxynitride, high dielectric constant (k) materials, other suitable materials, or combinations thereof.

Figure 5:
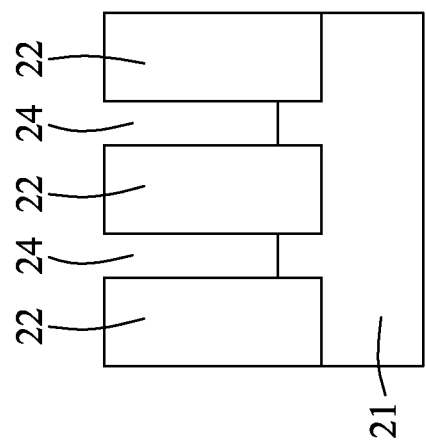

FIG. 5 is a schematic view illustrating that top portions or entire portions of the semiconductor strips 23 shown in FIG. 4 are removed to form recesses 24. A recess bottom of each of the recesses 24 may be level with, higher than, or lower than a bottom surface of the STI regions 22.

Figure 6:
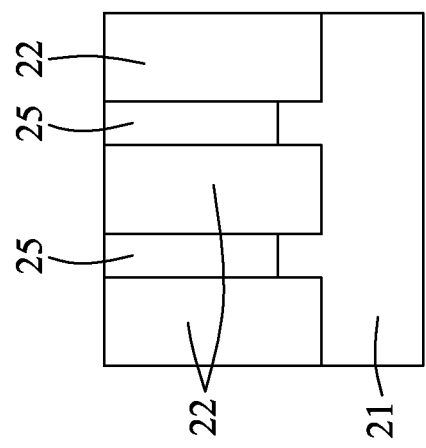

FIG. 6 is a schematic view illustrating that semiconductor strips 25 are selectively and epitaxially grown in the recesses 24 shown in FIG. 5. The semiconductor strips 25 may include, for example, but not limited to, silicon (Si), silicon germanium (SiGe), silicon boride (SiB), other suitable materials, or combinations thereof.

Figure 7:
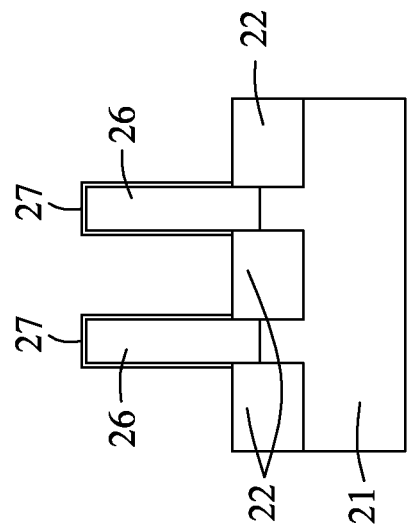

FIG. 7 is a schematic view illustrating that the STI regions 22 are recessed. The recessing of the STI regions 22 may be implemented by, for example, but not limited to, etching, other suitable methods, or combinations thereof. Parts of the semiconductor strips 25 (see FIG. 6) over top surfaces of the STI regions 22 are referred to as semiconductor fins 26 in FIG. 7. In alternative embodiments, the steps in FIGS. 5 and 6 may be skipped, and the semiconductor fins 26 may be formed from the semiconductor strips 23 shown in FIG. 4 and may have the same material as the semiconductor substrate 21.

Figure 8:
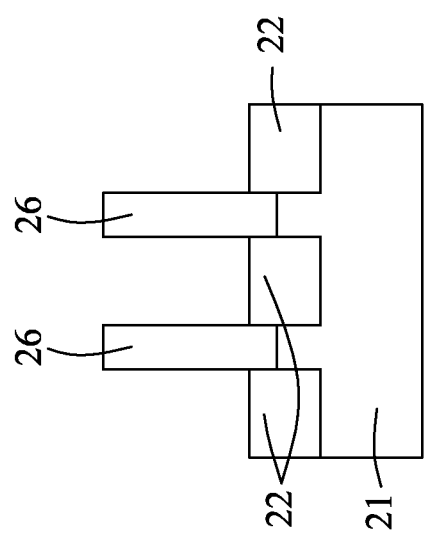

FIG. 8 is a schematic view illustrating that silicon cap layers 27 may be respectively and selectively formed on the semiconductor fins 26. In alternative embodiments, the step in FIG. 8 may be skipped.

In the drawings other than FIGS. 7 and 8, the semiconductor fins 26 for the n-FET region 200A are denoted by the reference numeral 26a, and the semiconductor fins 26 for the p-FET region 200B are denoted by the reference numeral 26b. In addition, the silicon cap layers 27 are not shown in some of the drawings for clarity.

Figure 9:
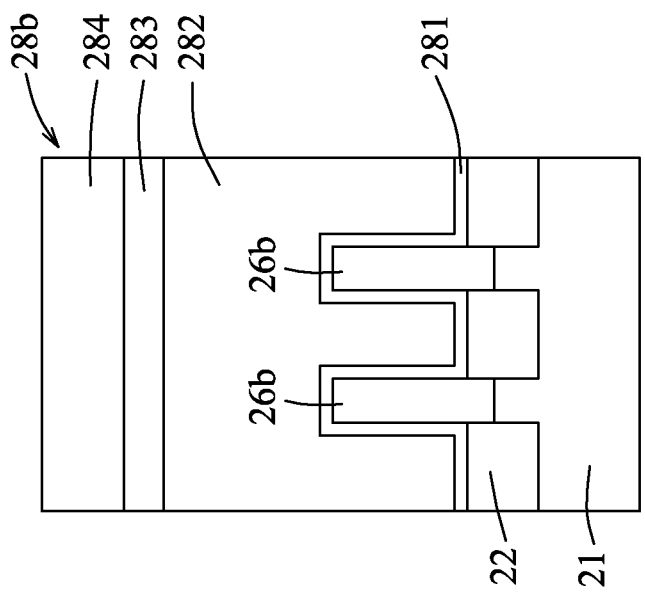

Referring back to FIGS. 1A and 2, in step 101, the dummy gate stacks 28a, 28b are respectively formed over the semiconductor fins 26a and 26b. FIG. 9 is a schematic cross-sectional view taken along A-A line of FIG. 2, and illustrating the intermediate state of the semiconductor fins 26b after step 101.

Figure 10:
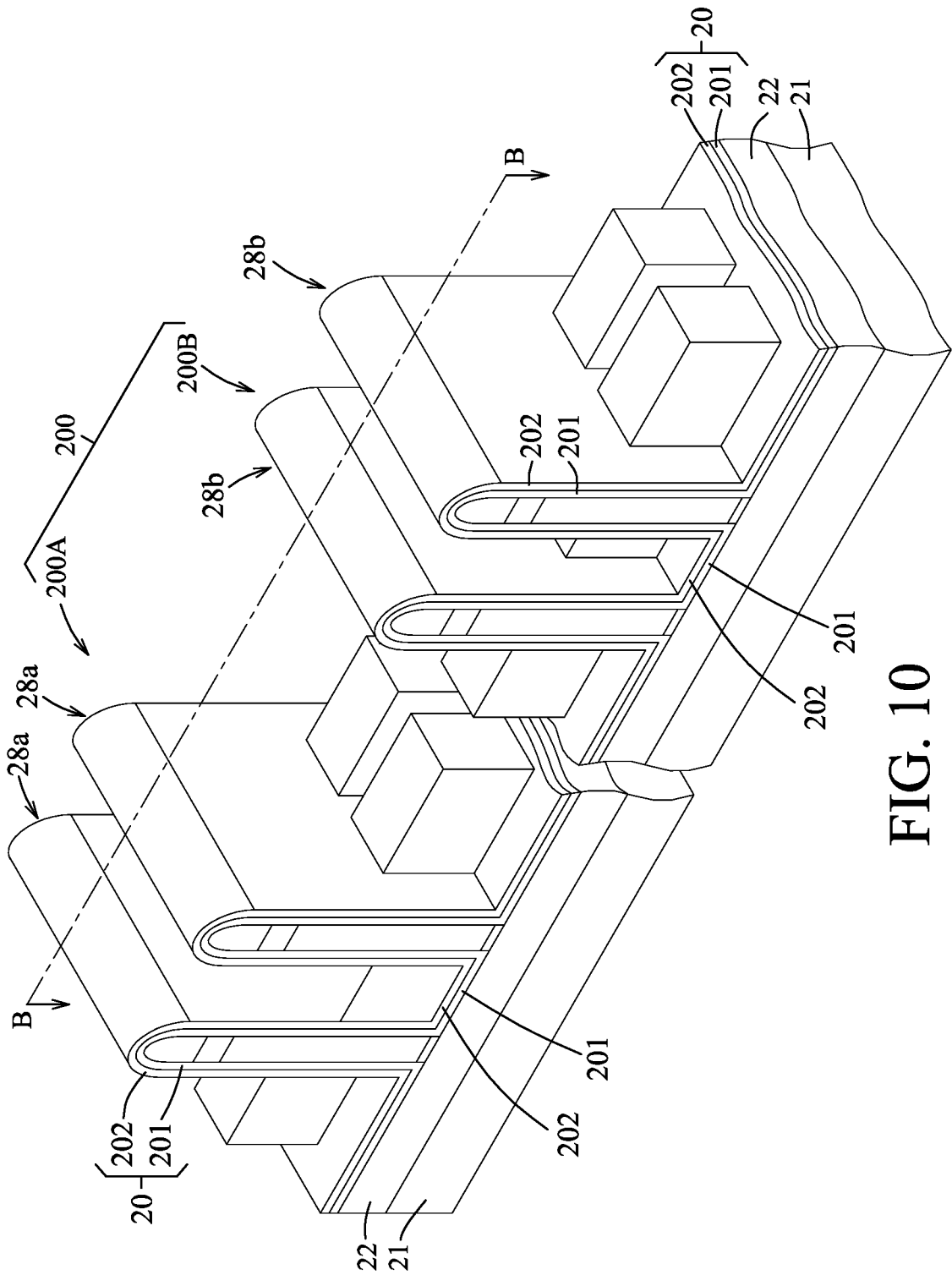
Figure 11:
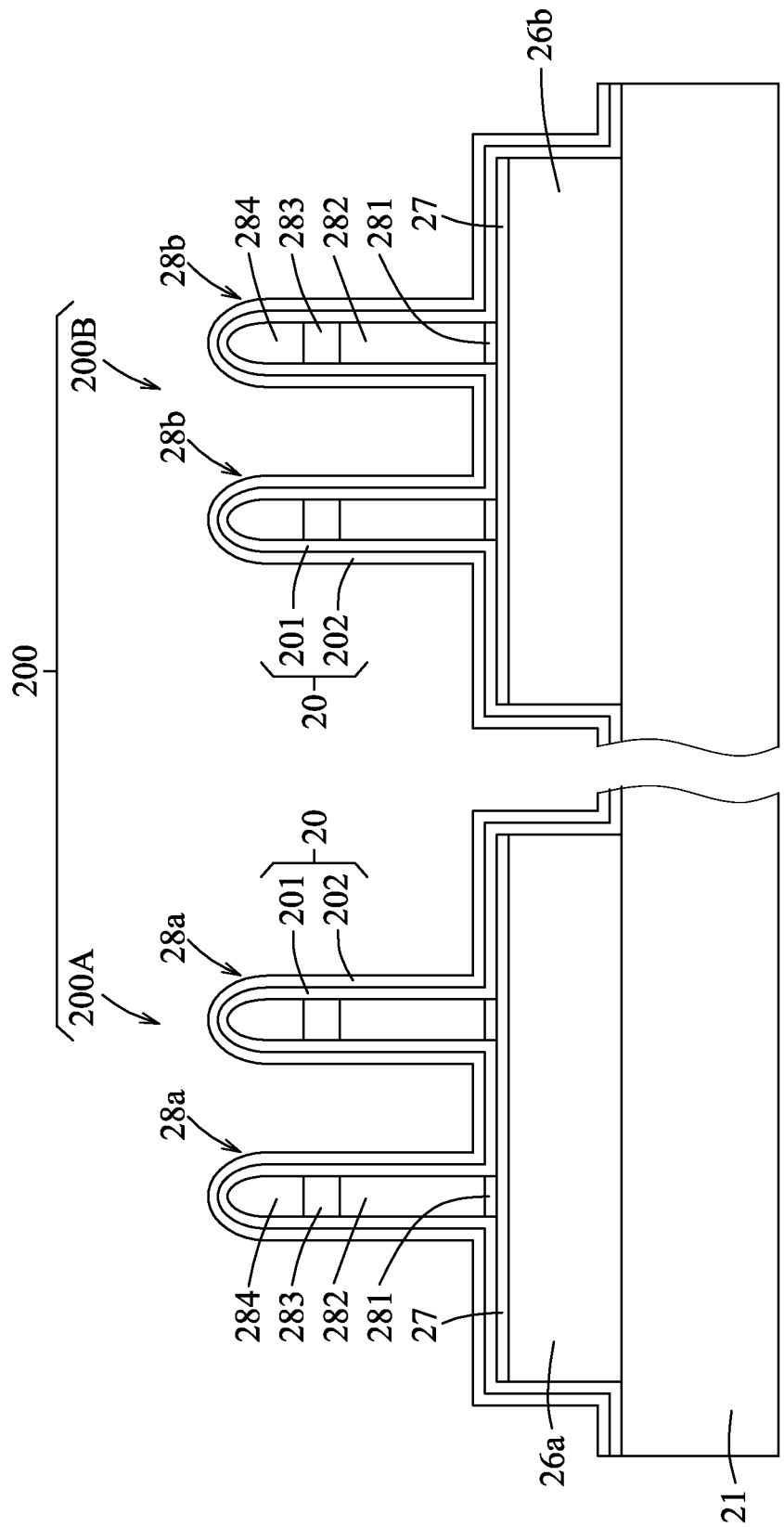

Referring to FIGS. 1A and 10, the method 100 proceeds to step 102, where a spacer layer 20 is formed over the semiconductor structure 200 obtained in step 101 through, for example, but not limited to, a blanket deposition process. FIG. 11 illustrates a schematic cross-sectional view taken along B-B line of FIG. 10. The spacer layer 20 may include an inner spacer layer 201 and an outer spacer layer 202. The inner spacer layer 201 may include, for example, but not limited to, a silicon carbon-containing material, a silicon oxide-containing material, other suitable materials, or combinations thereof, and the outer spacer layer 202 may include, for example, but not limited to, silicon nitride, other suitable materials, or combinations thereof. In alternative embodiments, the spacer layer 20 may include one or more than two spacer layers in step 101.

Figure 12:
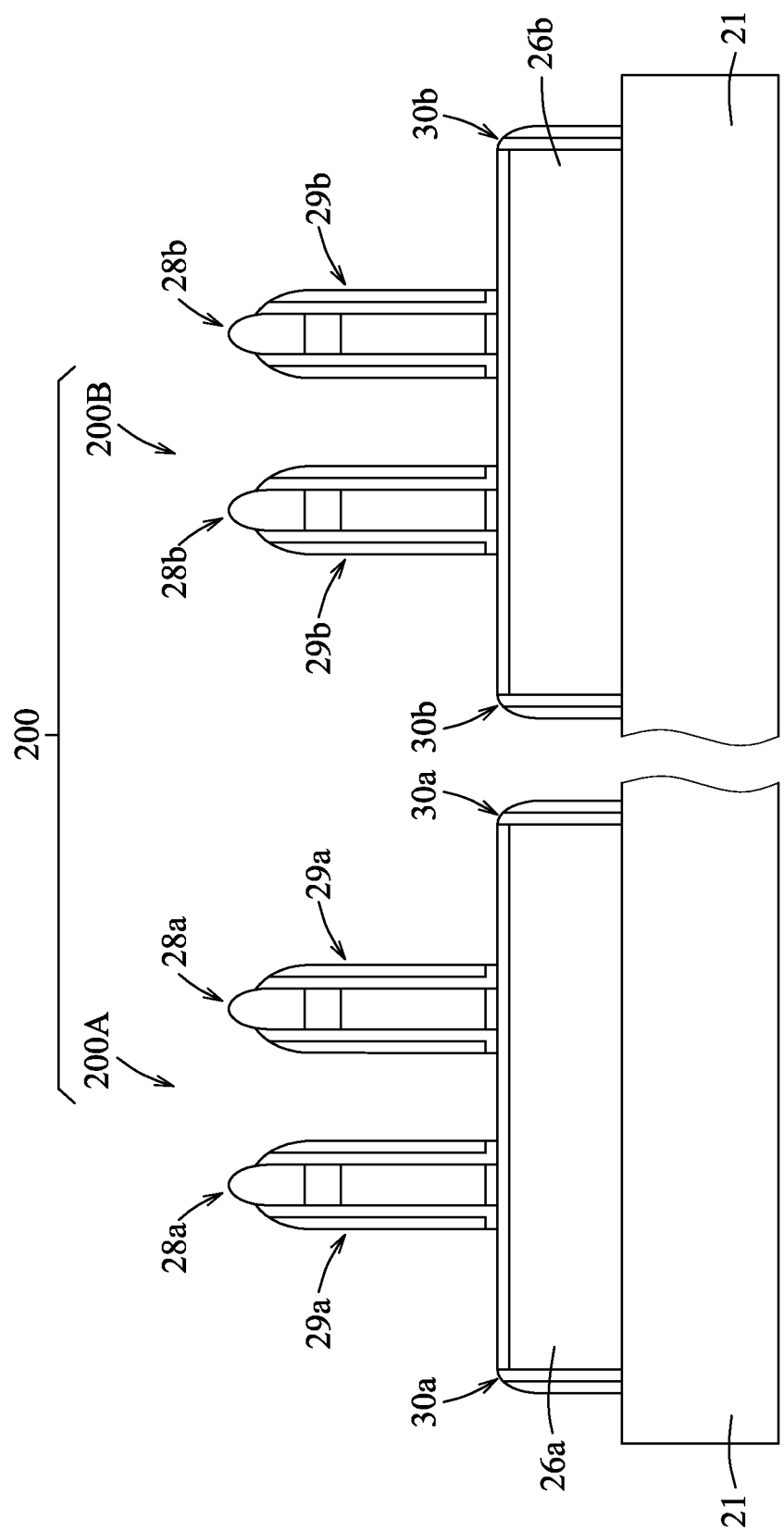

Referring to FIGS. 1A and 12, the method proceeds to step 103 where gate spacers 29a, 29b are respectively formed at lateral sides of the dummy gate stacks 28a, 28b, and fin spacers 30a, 30b are respectively formed at lateral sides of the semiconductor fins 26a, 26b. Step 102 is implemented by anisotropically etching the inner spacer layer 201 and the outer spacer layer 202 to permit the gate spacers 29a, 29b to be formed on the sidewalls of the dummy gate stack 28a, 28b and to permit the fin spacers 30a, 30b to be formed on the sidewalls of the semiconductor fins 26a, 26b.

Figure 13:
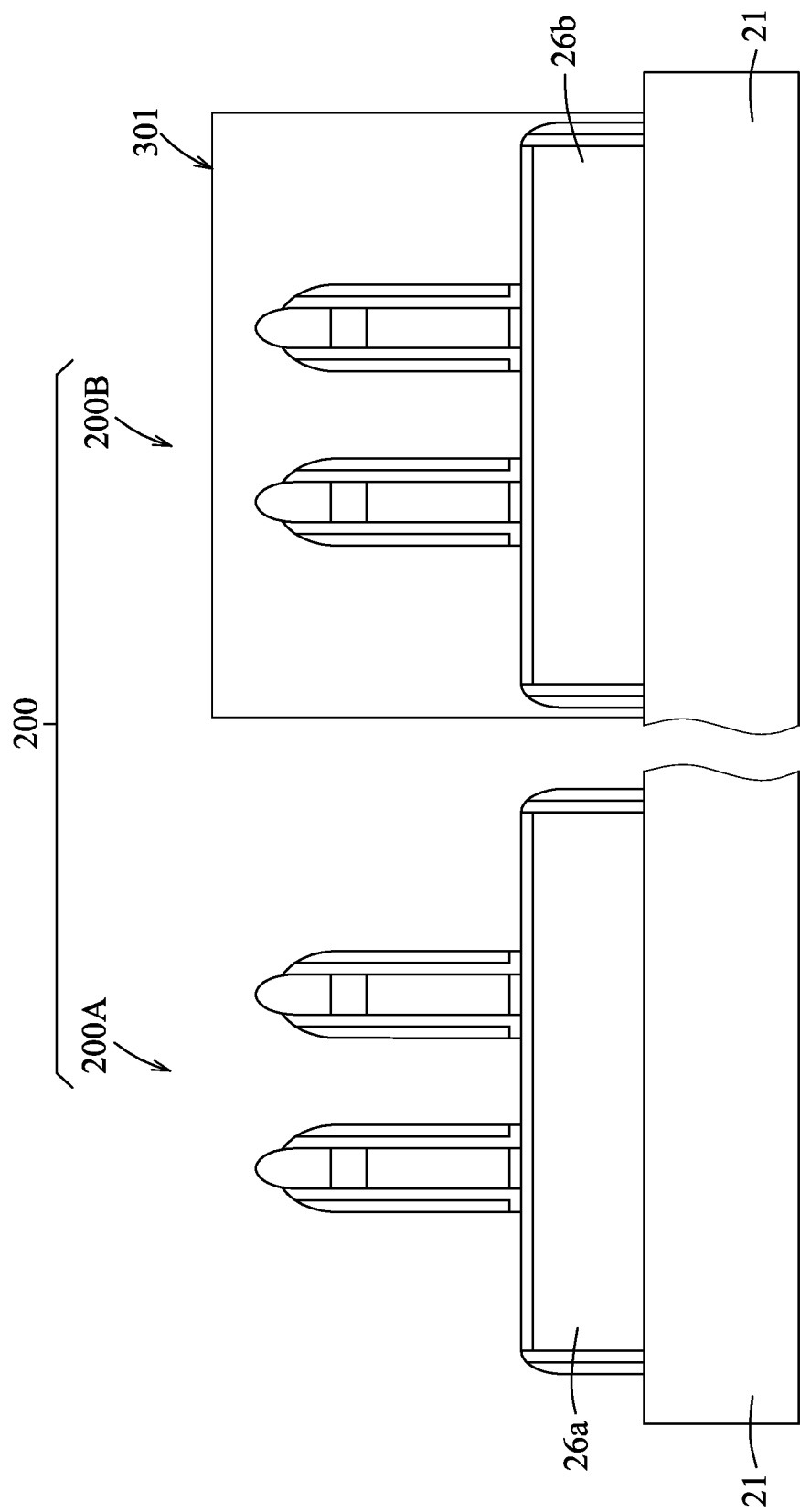

Referring to FIGS. 1A and 13, the method proceeds to step 104, where a photoresist 301 is applied and patterned to cover the p-FET region 200B. In some embodiments, the patterned photoresist 301 may be replaced by a patterned hard mask.

Figure 14:
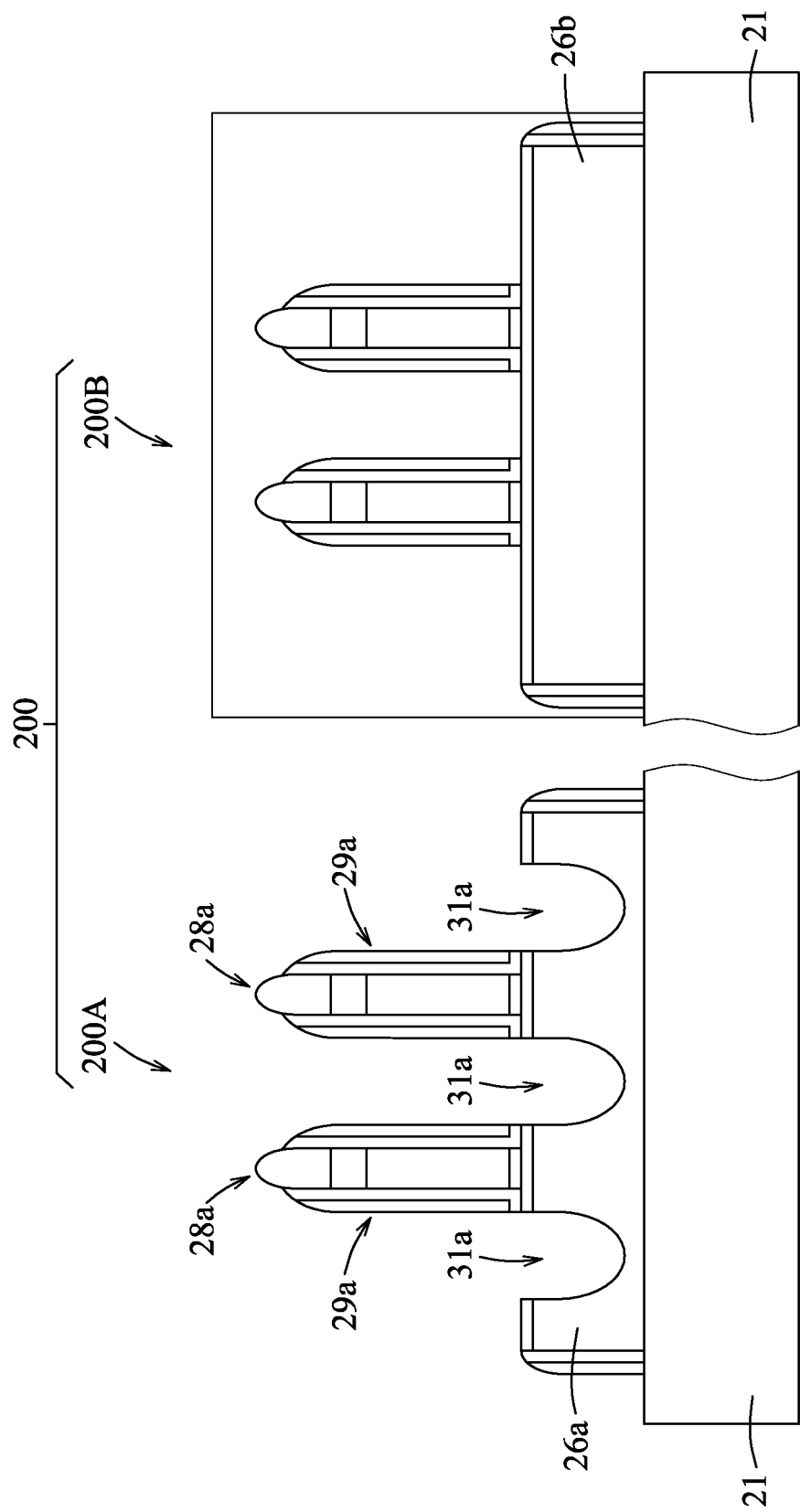

Referring to FIGS. 1A and 14, the method proceeds to step 105, where recesses 31a are etched into the semiconductor fins 26a (only one semiconductor fin 26a is shown in FIG. 14) of the n-FET region 200A at positions exposed from the dummy gate stacks 28a and the gate spacers 29a. Step 105 may be implemented through a known etching process in the art, such as, but not limited to, a dry etching process, a wet etching process, other suitable processes, or combinations thereof.

Figure 15:
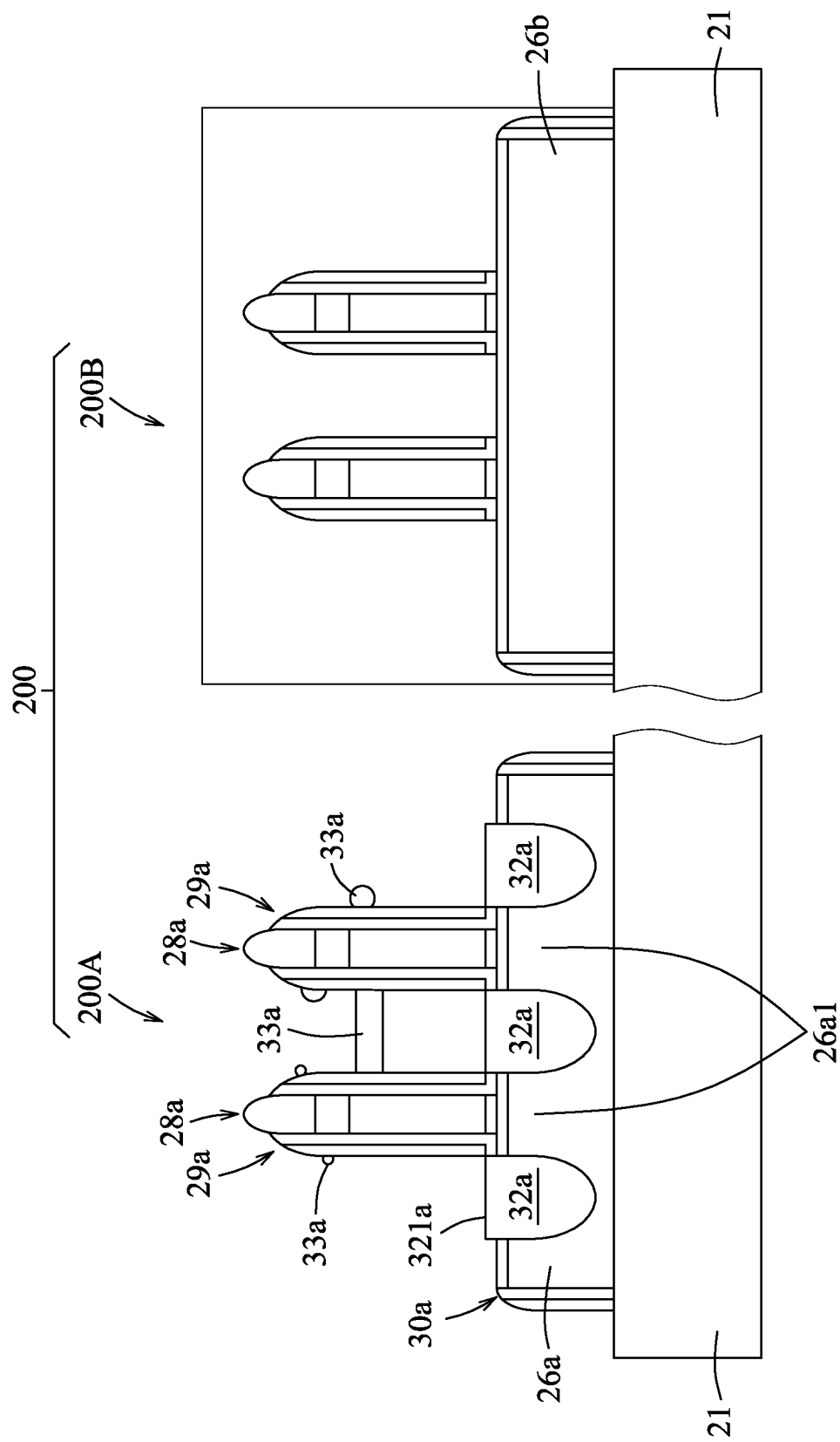

Referring to FIGS. 1A and 15, the method proceeds to step 106, where source-drain regions 32a are regrown in the recesses 31a shown in FIG. 14 through a selective epitaxial growth (SEG) process. The source-drain regions 32a may be, for example, but not limited to, crystalline silicon (or other suitable materials) in-situ doped with an n-type impurity during the SEG process. The n-type impurity may be, for example, but not limited to, phosphorous, nitrogen, arsenic, antimony, other suitable materials, or combinations thereof. After step 106, channel regions 26a1 are defined among the source-drain regions 32a. To function as an n-FET of a FinFET, the n-type impurity may be phosphorous which may have a concentration ranging from about 0 to about 1E21 atoms/cm$^3$, although other doping concentrations and/or other suitable n-type impurities may be used in alternative embodiments, depending on the device performance or the designs of the n-type semiconductor device to be produced. The source-drain regions 32a may include one or multiple layers. An outermost layer 321a of the source-drain regions 32a may serve as a sacrificial layer. During the SEG process, some ball-like defects 33a (which may also be referred to as "nodule defects," or "epitaxy selectively loss defects") may be grown on the gate spacers 29a, and sometimes may also be formed on the fin spacers 30a. The nodule defects 33a may have an amorphous phase (or polycrystalline phase) different from the crystalline phase of the source-drain regions 32a, and may include, for example, but not limited to, Si, SiP, SiAs, other possible materials, or combinations thereof.

Figure 16:
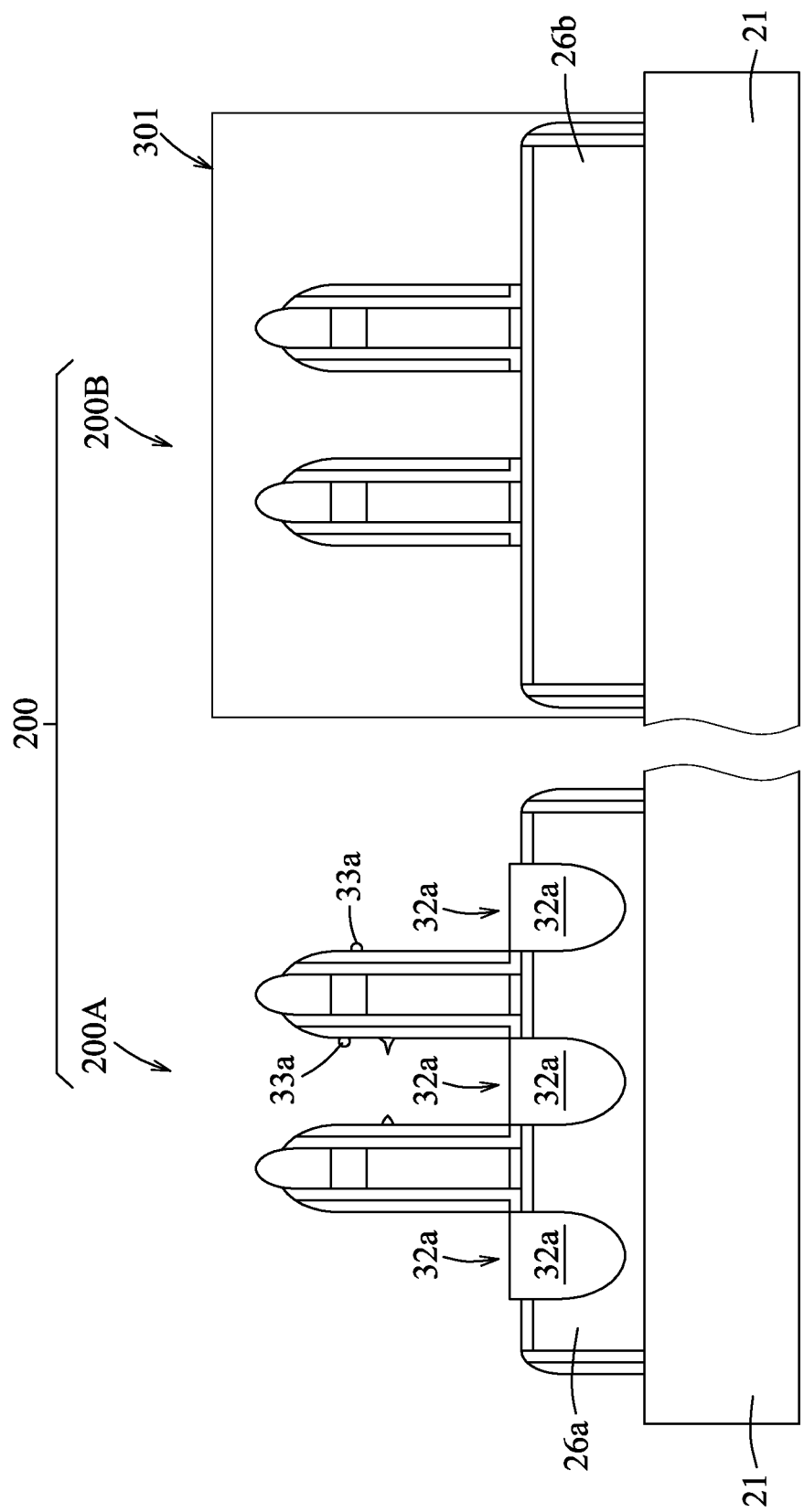

Referring to FIGS. 1A and 16, the method proceeds to step 107, where the nodule defects 33a shown in FIG. 15 are at least partially removed using a plasma. Because the plasma (for example, but not limited to, a hydrogen plasma) has a high etching selectivity to the amorphous phase material relative to the crystalline phase material, the nodule defects 33a may be easily and selectively removed by the plasma. The plasma may be generated by a plasma generation source, such as, but not limited, a transformer-coupled plasma generator, an inductively coupled plasma system, a magnetically enhanced reactive ion etching system, an electron cyclotron resonance system, a remote plasma generator, other suitable devices or systems, or combinations thereof. A gas source for generating the plasma may include an etching gas (for example, but not limited to, a hydrogen gas, other suitable gases, or combinations thereof) and may optionally further include a carrier gas (for dilution of the etching gas). The carrier gas may include, for example, but not limited to, a helium gas, an argon gas, other suitable gases, or combinations thereof. Based on the positions of the nodule defects, in order to selectively remove the nodule defects 33a, (i) a flow rate of the etching gas may be set in a range from about 10 sccm to about 2000 sccm, (ii) a flow rate of the carrier gas may be set in a range from about 50 sccm to about 6000 sccm, (iii) a process temperature may be set in a range from about 90° C. to about 600° C., and (iv) a process pressure may be set in a range from about 0.05 torr to about 6 torr. In alternative embodiments, a slightly higher or lower flow rate for each of the etching gas and the carrier gas, a slightly higher or lower process temperature, or a slightly higher or lower process pressure may be used, depending on the device performance or the designs of the semiconductor structure to be produced. After step 107, the patterned photoresist 301 is removed.

Figure 17:
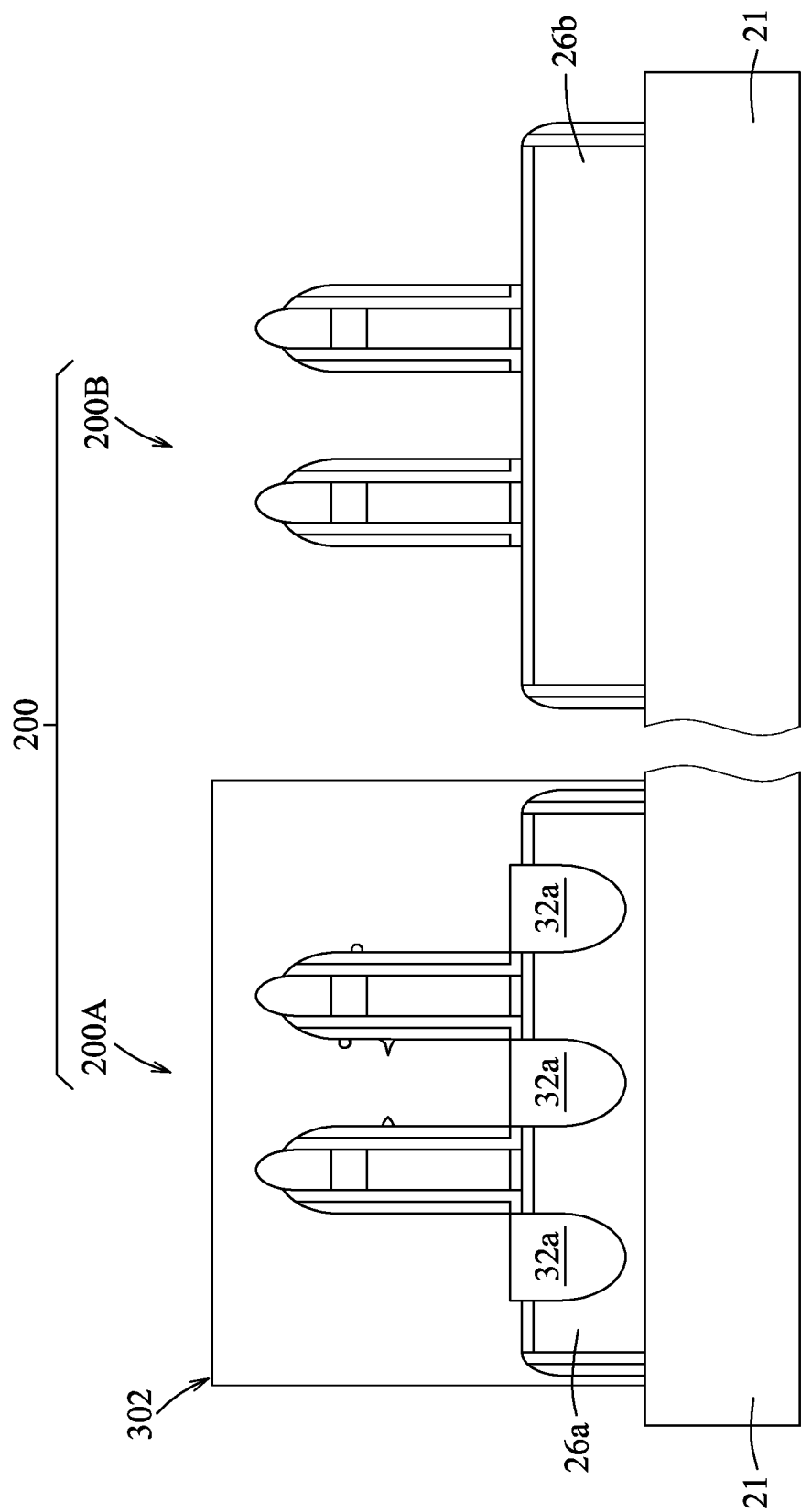

Referring to FIGS. 1A and 17, the method proceeds to step 108, where a photoresist 302 is applied and patterned to cover the n-FET region 200A. In some embodiments, the patterned photoresist 302 may be replaced by a patterned hard mask.

Figure 18:
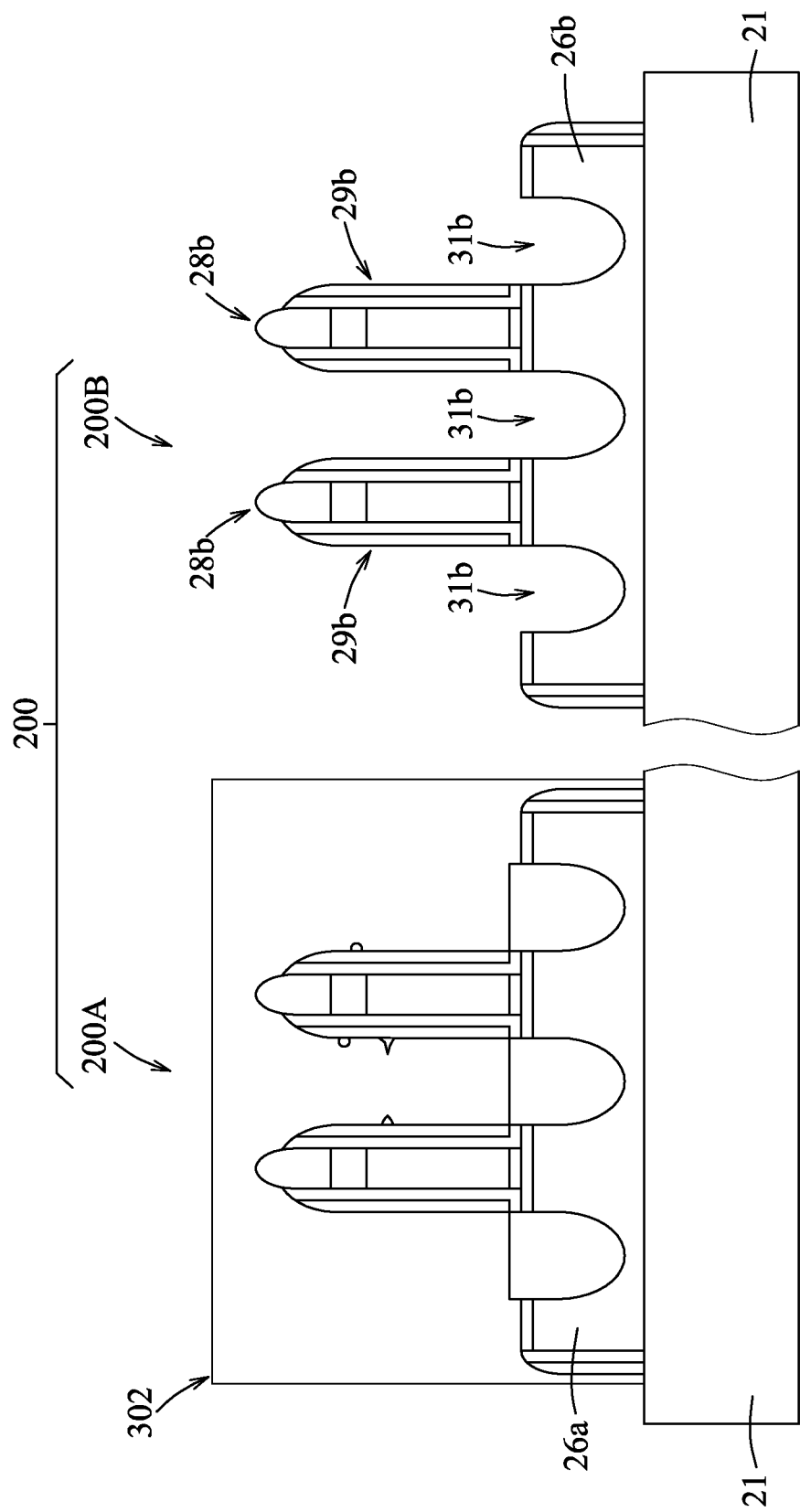

Referring to FIGS. 1A and 18, the method proceeds to step 109, where recesses 31b are etched into the semiconductor fins 26b (only one semiconductor fin 26b is shown in FIG. 18) of the p-FET region 200B at positions exposed from the dummy gate stacks 28b and the gate spacers 29b.

Figure 19:
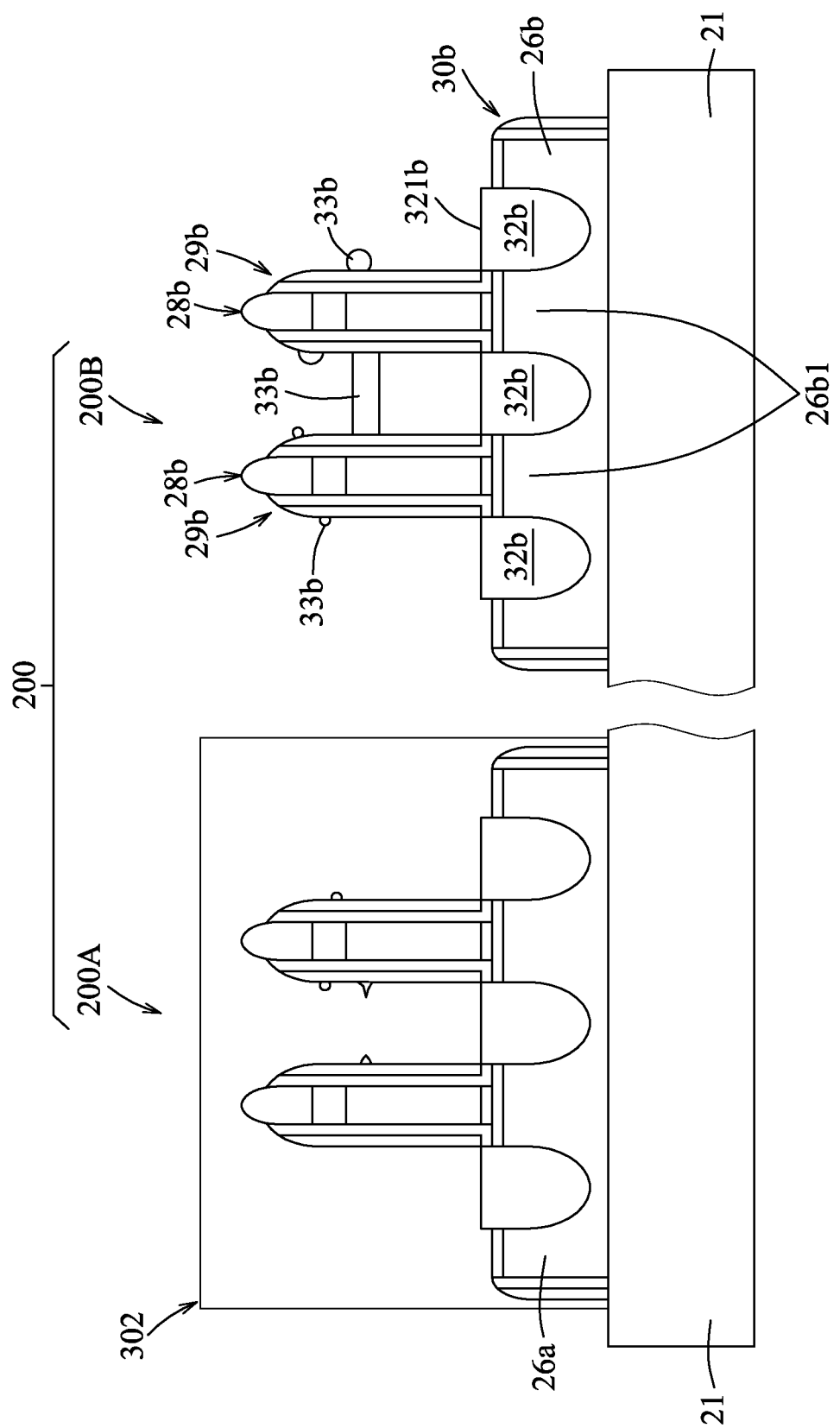

Referring to FIGS. 1A and 19, the method proceeds to step 110, where source-drain regions 32b are regrown in the recesses 31b shown in FIG. 18 through a selective epitaxial growth (SEG) process. The source-drain regions 32b may be, for example, but not limited to, crystalline silicon (or other suitable materials) in-situ doped with a p-type impurity during the SEG process. The p-type impurity may be, for example, but not limited to, germanium, boron, aluminum, gallium, indium, $BF_2$, other suitable materials, or combinations thereof. After step 110, channel regions 26b1 are defined among the source-drain regions 32b. To function as a p-FET of a FinFET, the p-type impurity may include germanium (which may have a concentration ranging from about 0% to about 40%) and boron (which may have a concentration ranging from about 0 to about 5E20 atoms/$cm^3$), although other doping concentrations and/or other suitable p-type impurities may be used in alternative embodiments, depending on the device performance or the designs of a p-type semiconductor device to be produced. The source-drain regions 32b may include one or multiple layers. An outermost layer 321b of each of the source-drain regions 32b may serve as a sacrificial layer. During the SEG process, some ball-like defects 33b (which may also be referred to as "nodule defects," or "epitaxy selectively loss defects") may be grown on the gate spacers 29b, and sometimes may also be formed on the fin spacers 30b. The nodule defects 33b may have an amorphous phase (or polycrystalline phase) different from the crystalline phase of the source-drain regions 32b, and may include, for example, but not limited to, Si, SiGe, SiGeB, other possible materials, or combinations thereof.

Figure 20:
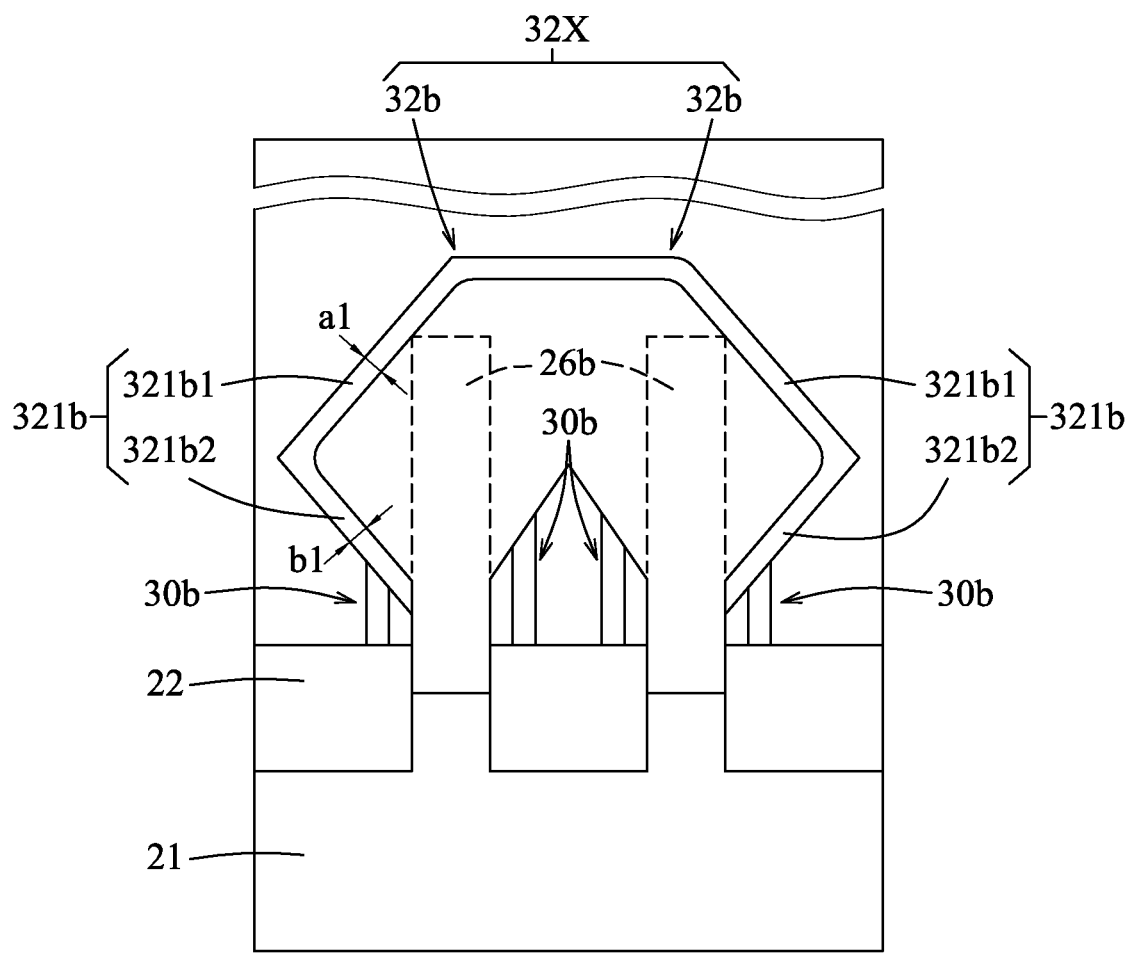

FIG. 20 is a schematic cross-sectional view similar to FIG. 9 but illustrating the intermediate state of the semiconductor fins 26b after step 110. In FIG. 20, parts of the semiconductor fins 26b represented by dashed lines are the channel regions 26b1 (see FIG. 19) of the semiconductor fins 26b located beneath one of the dummy gate stacks 28b. The two source-drain regions 32b at the two adjacent semiconductor fins 26b (see FIG. 2) are grown together to form a diamond-like shape structure 32X, and the outermost sacrificial layers 321b thereof may be connected to each other continuously. Each of the outermost sacrificial layers 321b may have a first region 321b1 distal from the semiconductor substrate 21 and a second region 321b2 proximate to the semiconductor substrate 21. A thickness (a1) of the first region 321b1 is substantially the same as a thickness (b1) of the second region 321b2. The diamond-like shape structure 32X after step 110 has two corners each of which is located between the first region 321b1 and the second region 321b2 of a corresponding one of the outermost sacrificial layers 321b.

Figure 21:
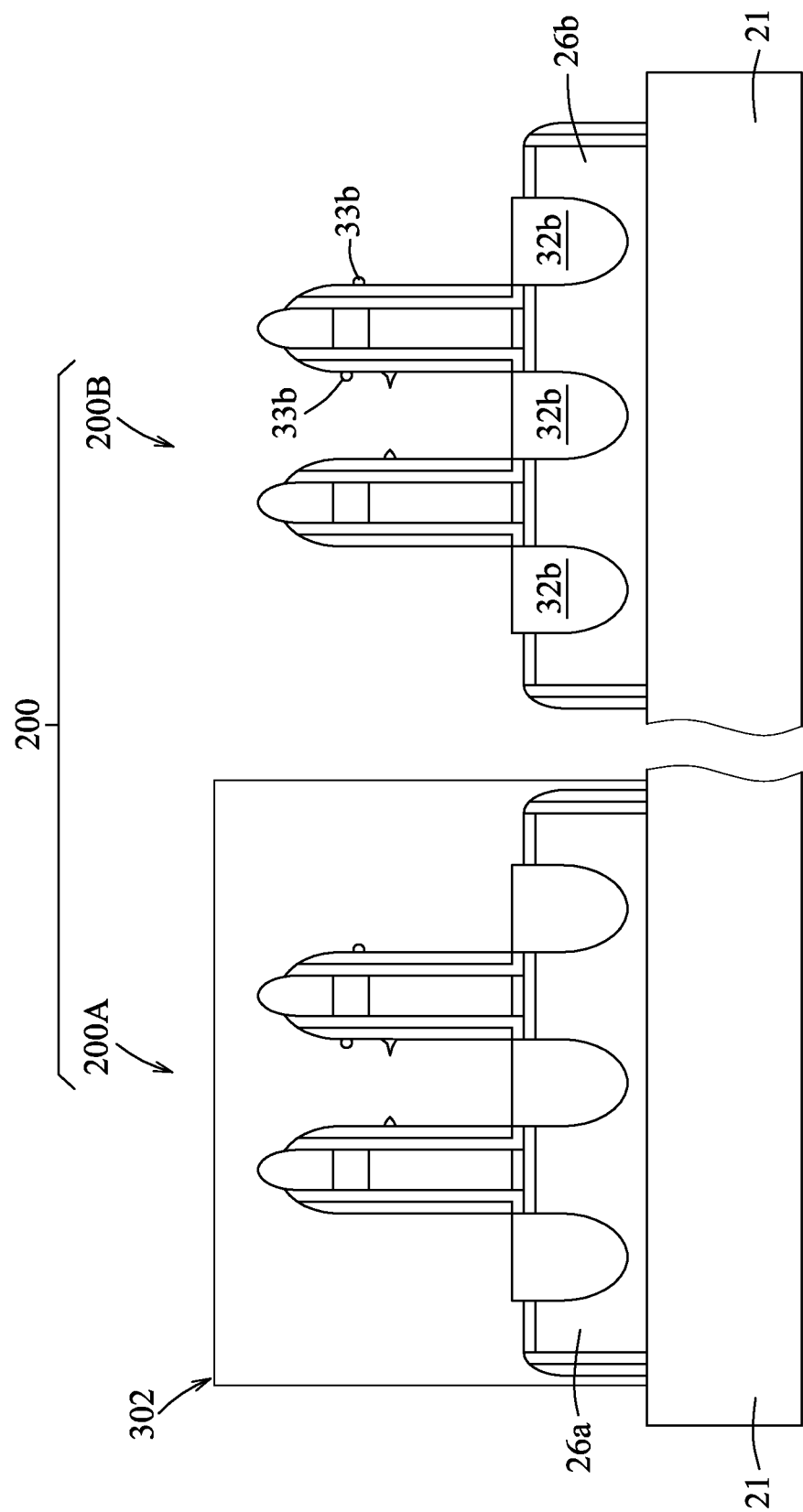

Referring to FIGS. 1A and 21, the method proceeds to step 111, where the nodule defects 33b shown in FIG. 19 are at least partially removed using a plasma. The plasma generation source and the parameters for generating the plasma may be similar to those described in step 107. After step 111, the patterned photoresist 302 is removed.

Figure 22:
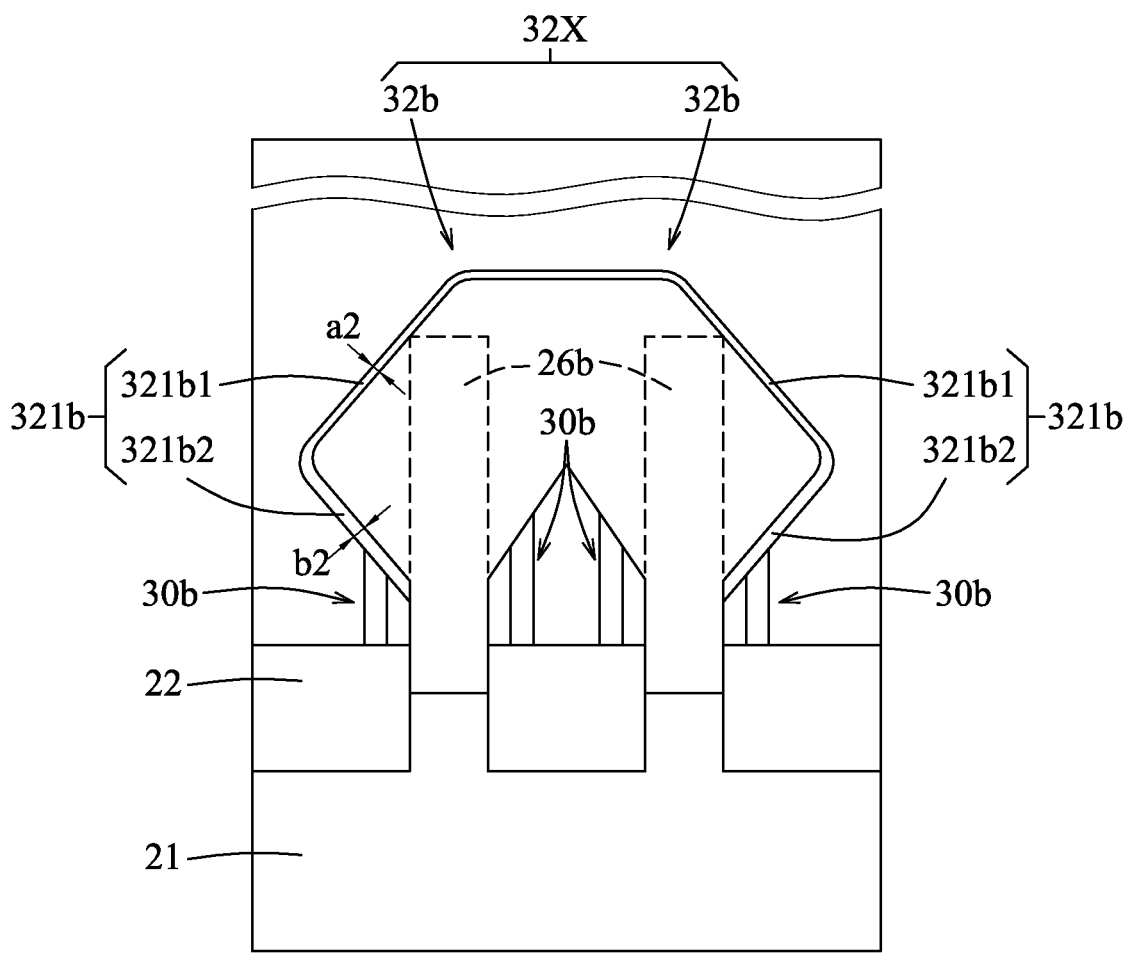

FIG. 22 is a schematic cross-sectional view similar to FIG. 20 but illustrating the intermediate state of the semiconductor fins 26b after treatment of the plasma (step 111). In FIG. 22, the thickness (a2) of the first region 321b1 is smaller than the thickness (b2) of the second region 321b2. In the other case that the plasma is not applied in step 111, the first region 321b1 and the second region 321b2 may have substantially the same thickness.

Figure 23:
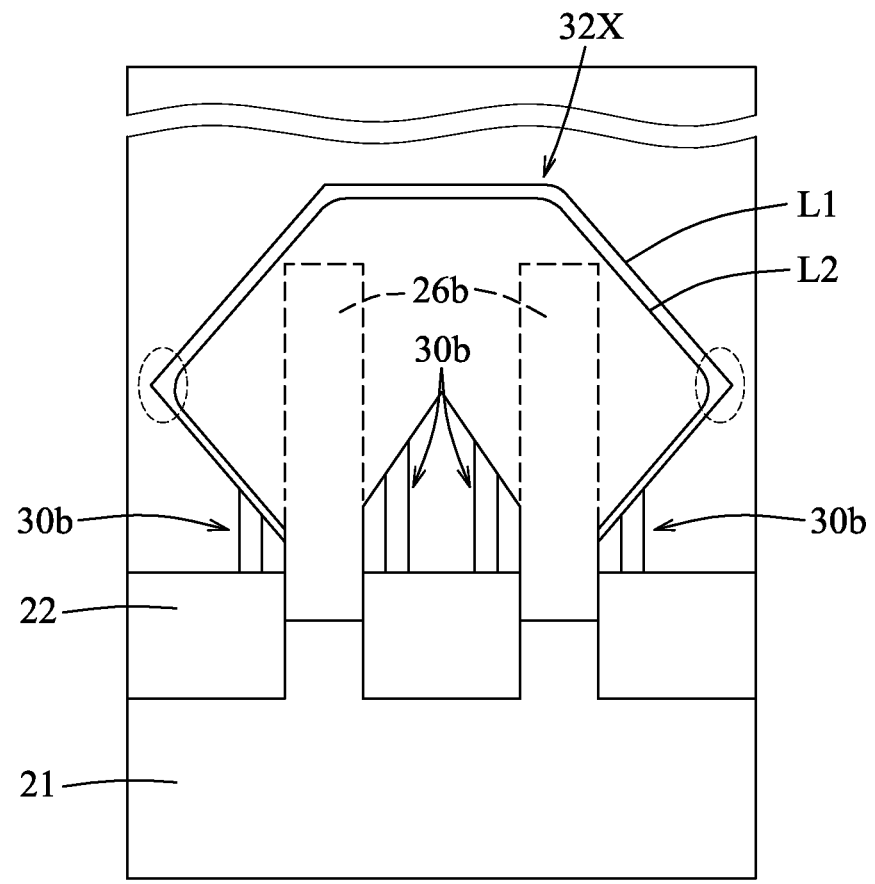

FIG. 23 is a schematic view in which a first line (L1) represents an outer contour of the diamond-like shape structure 32X before step 111 of applying the plasma, and a second line (L2) represents an outer contour of the diamond-like shape structure 32X after step 111 of applying the plasma. It can be found that the corners of the diamond-like shape structure 32X (encircled by dashed lines in FIG. 23) are rounded by the plasma. Therefore, it may be concluded that evidences of applying the plasma may include that (i) the first region 321b1 has a smaller thickness than the second region 321b2, and (ii) the diamond-like shape structure 32X has rounded corners.

In some embodiments, steps 108 to 111 may be implemented after steps 104 to 107. In alternative embodiments, steps 108 to 111 may be implemented before steps 104 to 107. In yet alternative embodiments, based on the design of the semiconductor structure 200, only one of steps 107 and 111 may be implemented.

Figure 24:
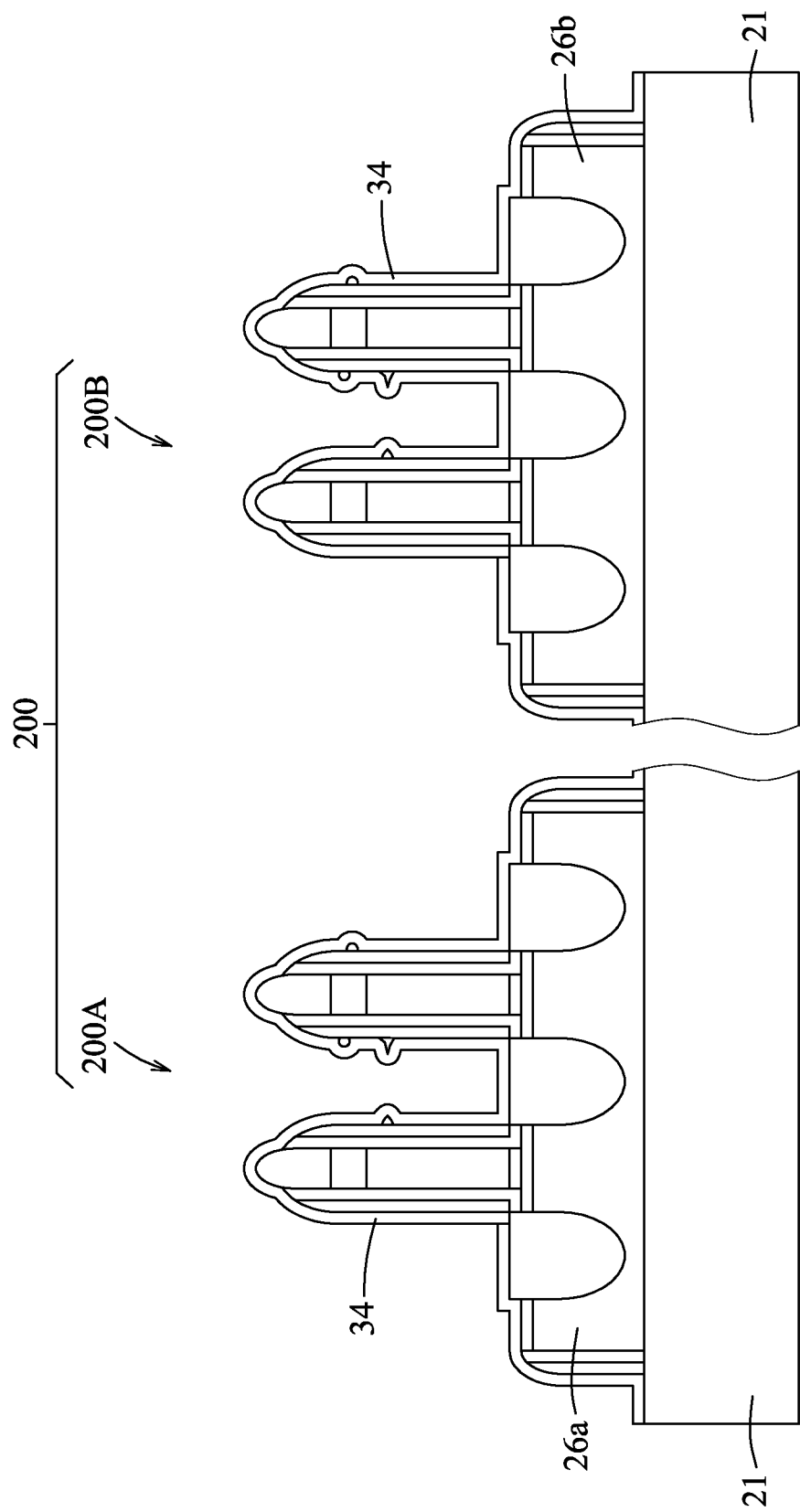

Referring to FIGS. 1A and 24, the method 100 proceeds to step 112, where a contact etch stop layer (CESL) 34 is formed over each of the n-FET region 200A and the p-FET region 200B of the semiconductor structure 200. The CESL 34 may include, for example, but not limited to, silicon nitride, carbon-doped silicon nitride, other suitable materials, or combinations thereof, and may be formed using a blanket deposition process, such as, but not limited to, chemical vapor deposition (CVD), high density plasma CVD (HDPCVD), sub-atmospheric CVD (SACVD), molecular layer deposition (MLD), other suitable methods, or combinations thereof.

Figure 25:
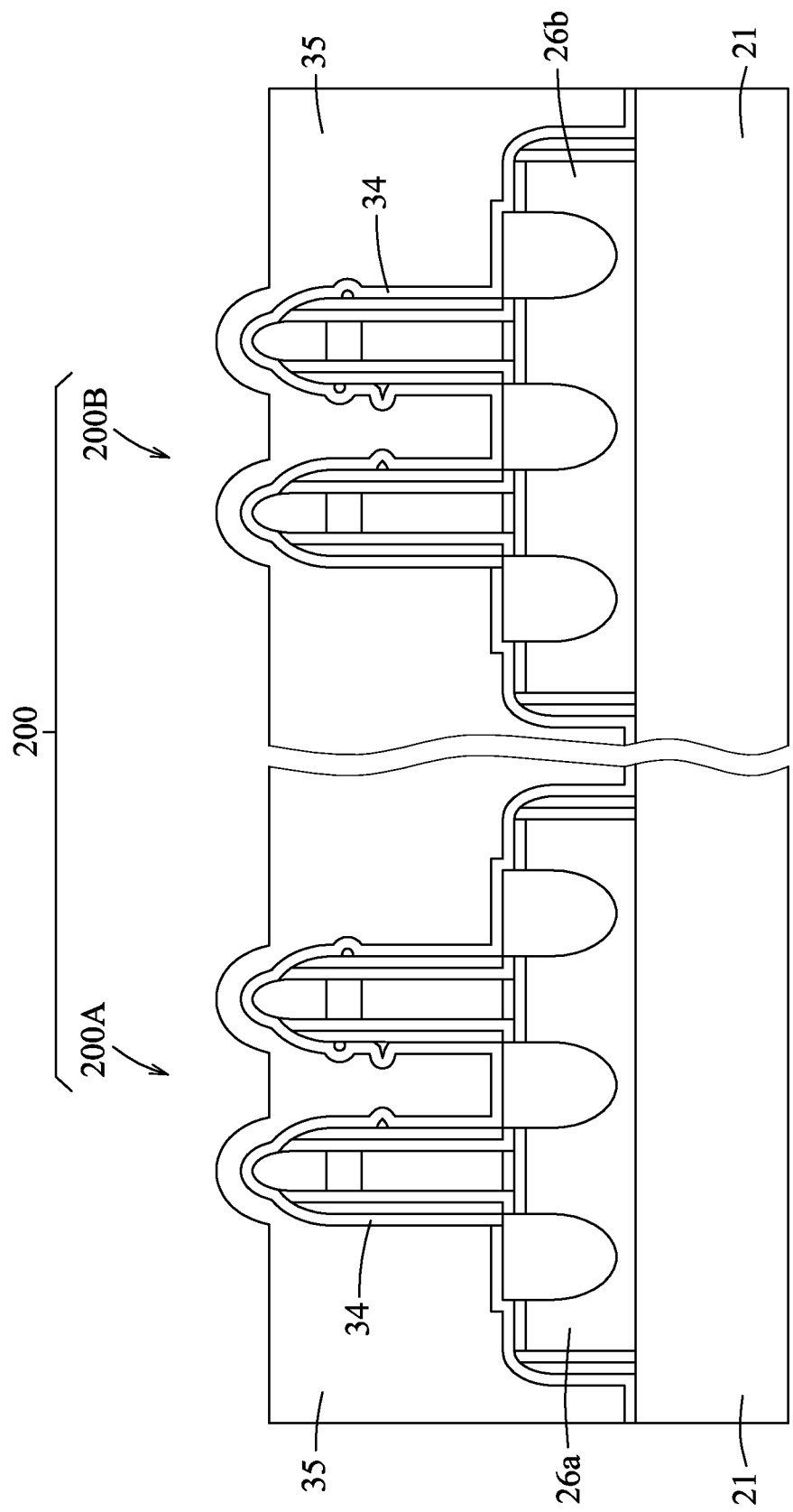

Referring to FIGS. 1A and 25, the method 100 proceeds to step 113, where an interlayer dielectric (ILD) layer 35 is formed over the CESL 34 of each of the n-FET region 200A and the p-FET region 200B. The ILD layer 35 may include a dielectric material such as, but not limited to, silicon oxide, silicon nitride, silicon oxynitride, other suitable materials, or combinations thereof. The ILD layer 35 may be formed by blanket depositing a layer of the dielectric material using, for example, but not limited to, CVD, HDPCVD, SACVD, MLD, other suitable methods, or combinations thereof.

Figure 26:
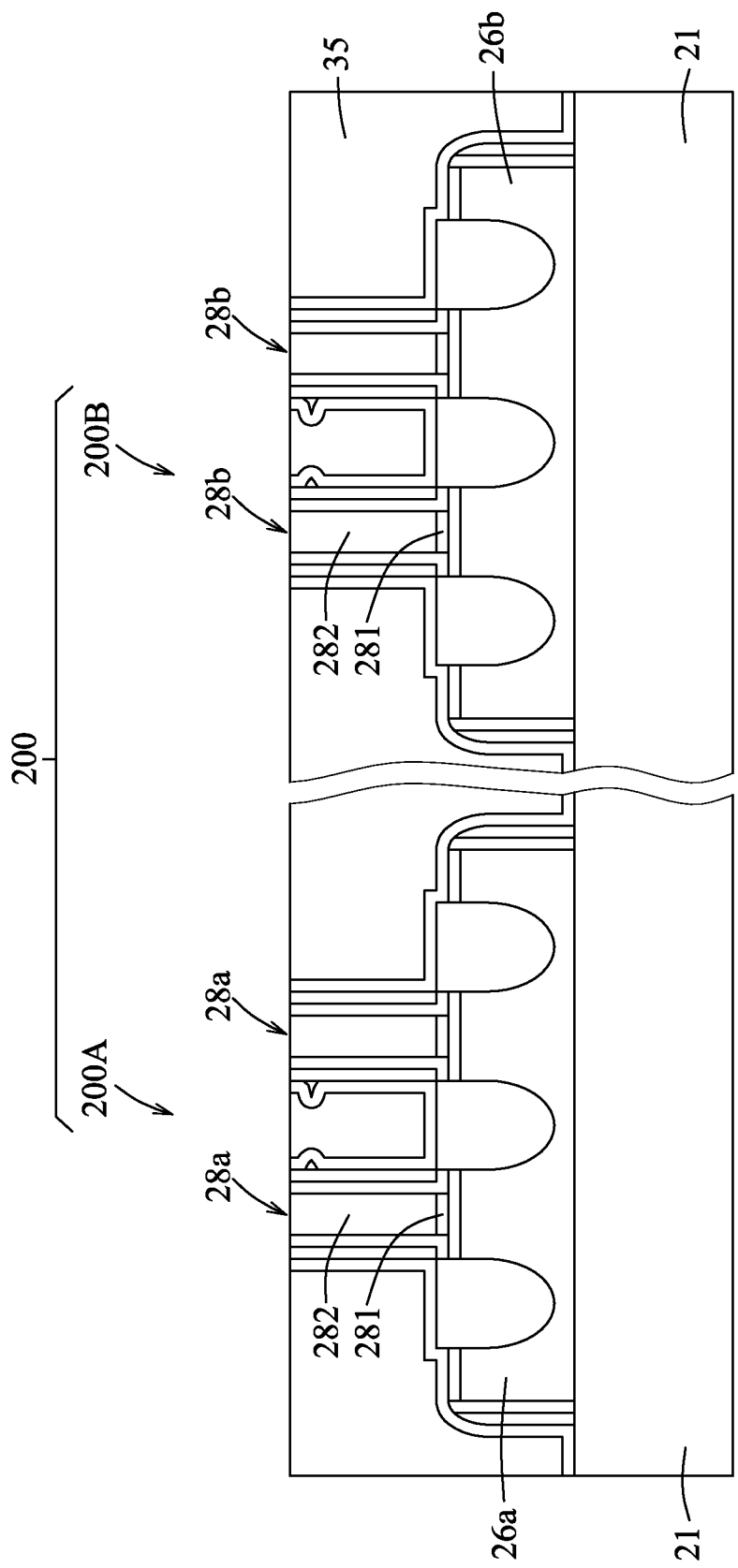

Referring to FIGS. 1A and 26, the method 100 proceeds to step 114, where the ILD layer 35 is planarized by using, for example, but not limited to, chemical mechanical polishing (CMP), other suitable methods, or combinations thereof, to expose the dummy gate electrodes 282 of the dummy gate stacks 28a, 28b.

Following steps 115 to 120 are the steps for a replacement gate (RPG) process in which the dummy gate electrodes 282 and the dummy gate dielectrics 281 of the dummy gate stacks 28a, 28b shown in FIG. 26 are replaced.

Figure 27:
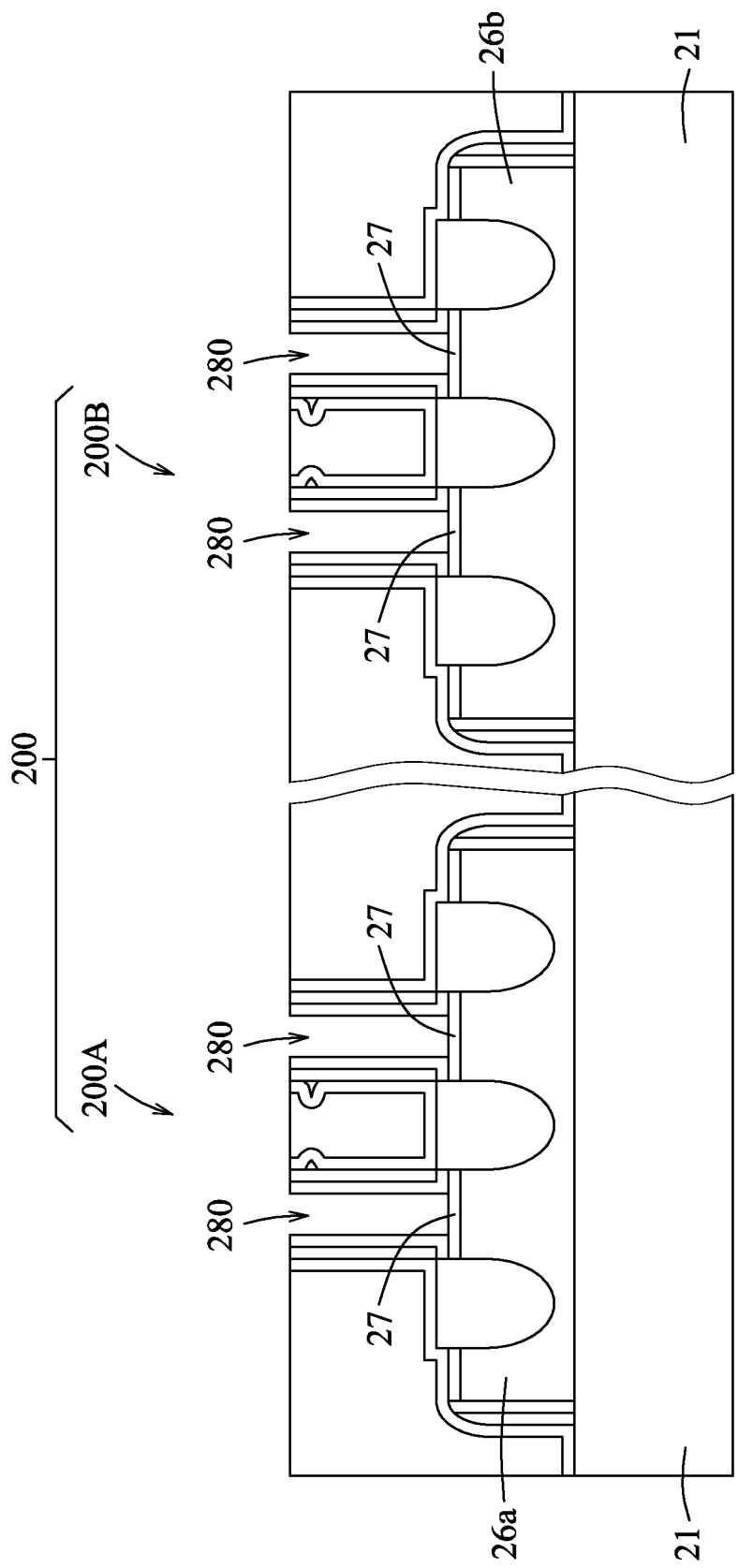

Referring to FIGS. 1B and 27, the method 100 proceeds to step 115, where the dummy gate electrodes 282 and the dummy gate dielectrics 281 of the dummy gate stacks 28a, 28b shown in FIG. 26 are removed to form recesses 280 in the n-FET region 200A and the p-FET region 200B. Step 115 may be implemented through a known etching process in the art, such as, but not limited to, a dry etching process, a wet etching process, other suitable processes, or combinations thereof. The recesses 280 may be formed to expose the silicon cap layers 27 (if any). The silicon cap layers 27 may be provided to prevent the semiconductor fins 26a, 26b from being damaged in step 115.

Figure 28:
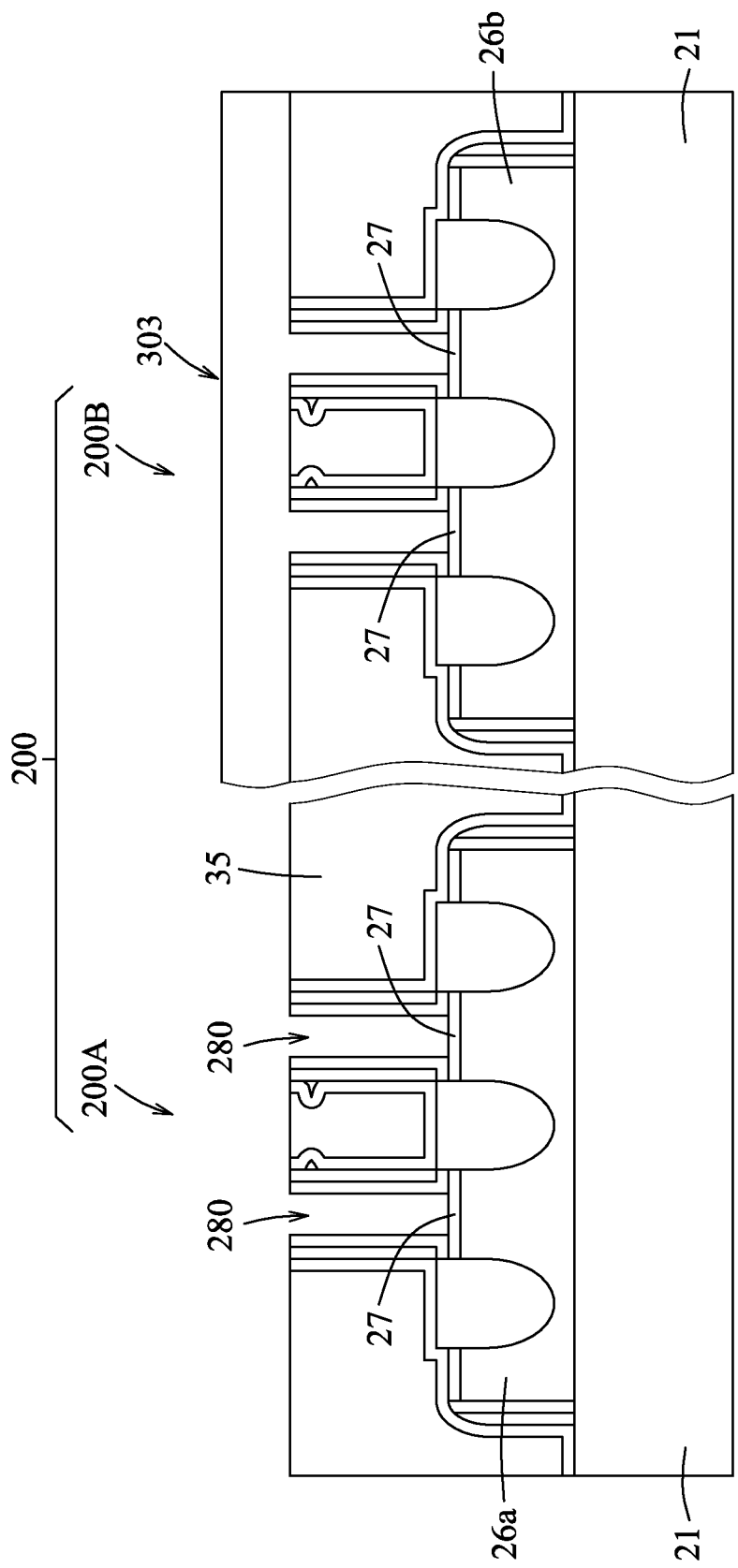

Referring to FIGS. 1B and 28, the method 100 proceeds to step 116, where a photoresist 303 is applied and patterned to cover the p-FET region 200B. In some embodiments, the patterned photoresist 303 may be replaced by a patterned hard mask.

Figure 29:
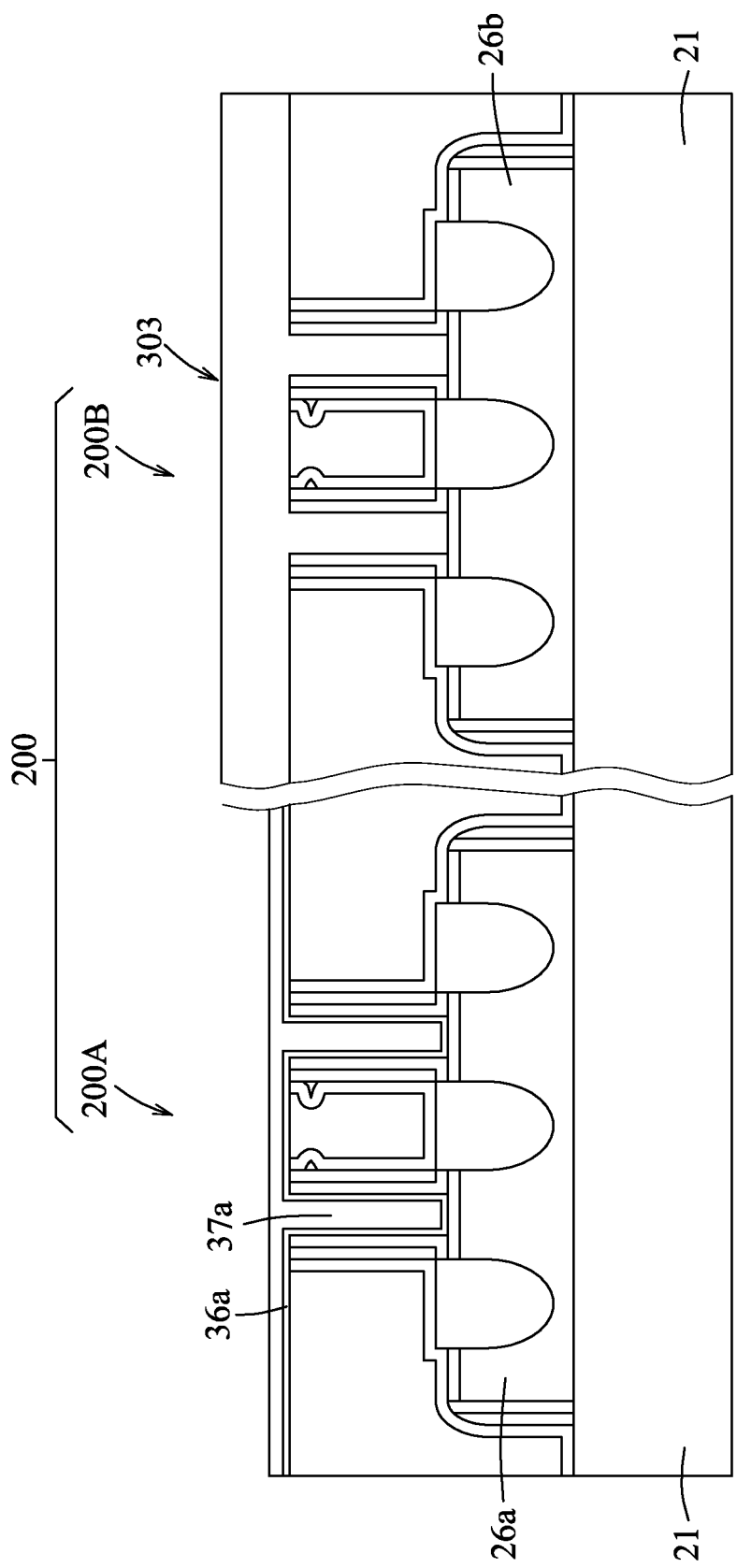

Referring to FIGS. 1B and 29, the method 100 proceeds to step 117, where a gate dielectric layer 36a and a metal filling layer 37a are sequentially formed over the top surface of the ILD layer 35 and to fill in the recesses 280 of the n-FET region 200A shown in FIG. 28 through a blanket deposition process using CVD, HDPCVD, SACVD, MLD, physical vapor deposition (PVD), sputtering, other suitable methods, or combinations thereof. The gate dielectric layer 36a may include, from inner to outer, an interlayer dielectric (which may include, but not limited to, silicon oxide, silicon nitride, silicon oxynitride, other suitable materials, or combinations thereof) and a layer of high dielectric constant (k) material or other suitable materials. The metal filling layer 37a may include, from inner to outer, a barrier layer (not shown, which may prevent diffusion of a metal into the gate dielectric layer 36a), an n-type work function layer (not shown, which may include, such as, but not limited to, titanium, aluminum, tantalum carbide, tantalum carbide nitride, tantalum silicon nitride, other suitable materials, or combinations thereof), and a filling material layer (not shown, which may include, but not limited to, aluminum, tungsten, copper, other conductive metals, or combinations thereof). After step 117, the photoresist 303 is removed.

Figure 30:
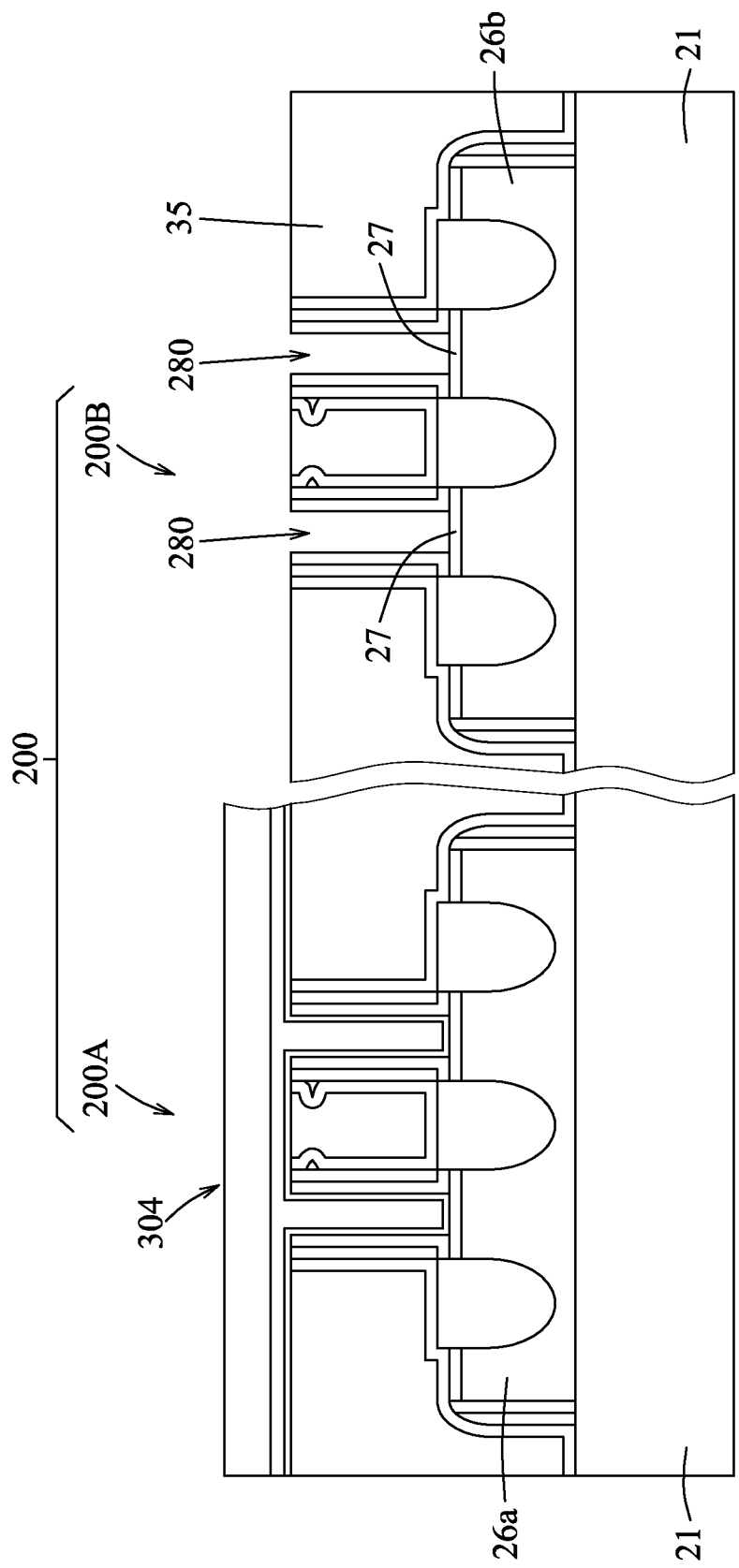

Referring to FIGS. 1B and 30, the method 100 proceeds to step 118, where a photoresist 304 is applied and patterned to cover the n-FET region 200A, and the p-FET region 200B is exposed. In some embodiments, the patterned photoresist 304 may be replaced by a patterned hard mask.

Figure 31:
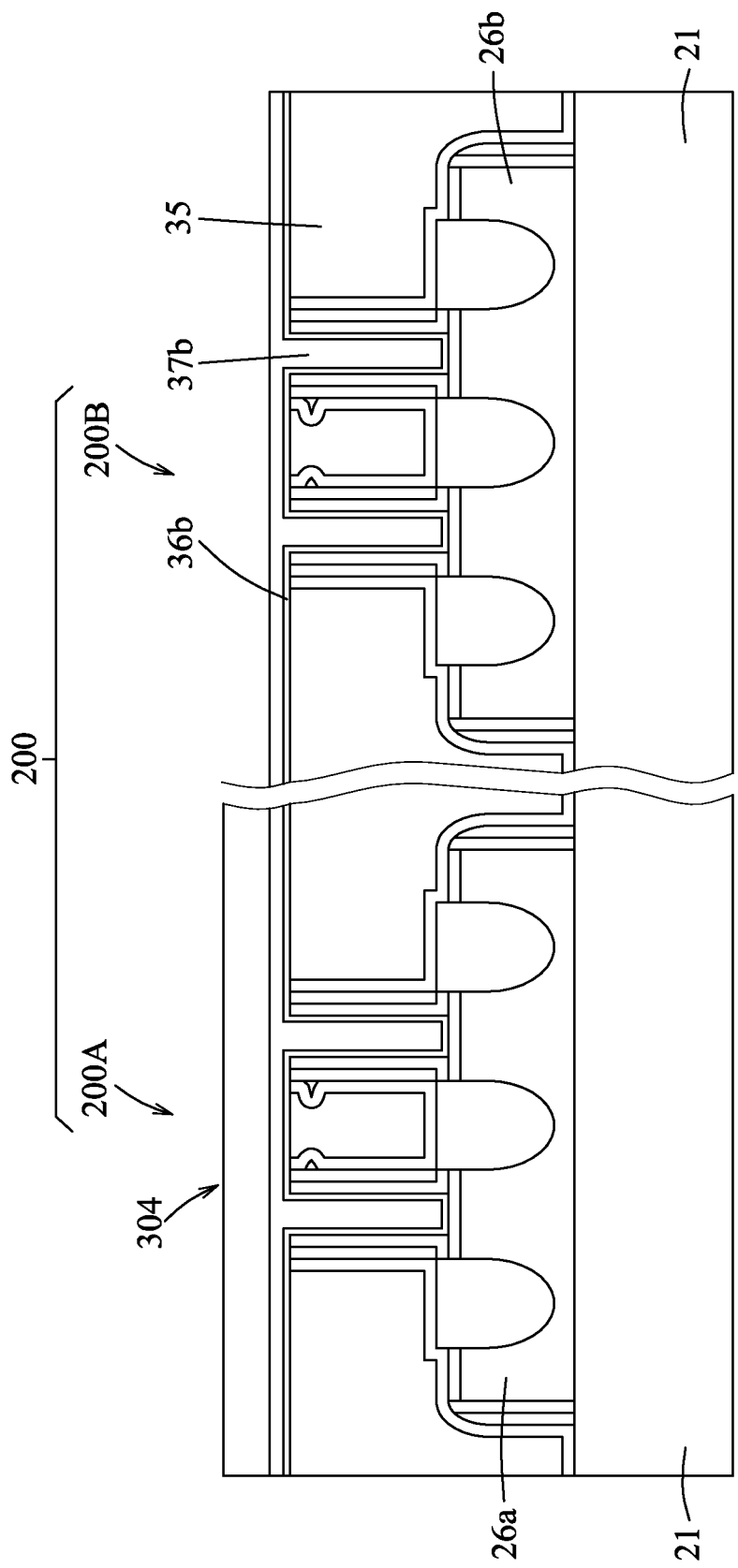

Referring to FIGS. 1B and 31, the method 100 proceeds to step 119, where a gate dielectric layer 36b and a metal filling layer 37b are sequentially formed over the top surface of the ILD layer 35 and to fill in the recesses 280 of the p-PET region 200B shown in FIG. 30 through a blanket deposition process using CVD, HDPCVD, SACVD, MLD, PVD, sputtering, other suitable methods, or combinations thereof. The gate dielectric layer 36b may include, from inner to outer, an interlayer dielectric (which may include, but not limited to, silicon oxide, silicon nitride, silicon oxynitride, other suitable materials, or combinations thereof) and a layer of high dielectric constant (k) material or other suitable materials. The metal filling layer 37b may include, from inner to outer, a barrier layer (not shown, which may prevent diffusion of a metal into the gate dielectric layer 36b), a p-type work function layer (not shown, which may include, but not limited to, titanium nitride, tantalum nitride, ruthenium, molybdenum, tungsten, platinum, other suitable materials, or combinations thereof) and a filling material layer (not shown, which may include, but not limited to, aluminum, tungsten, copper, other suitable materials, or combinations thereof). After step 119, the patterned photoresist 304 is removed.

Figure 32:
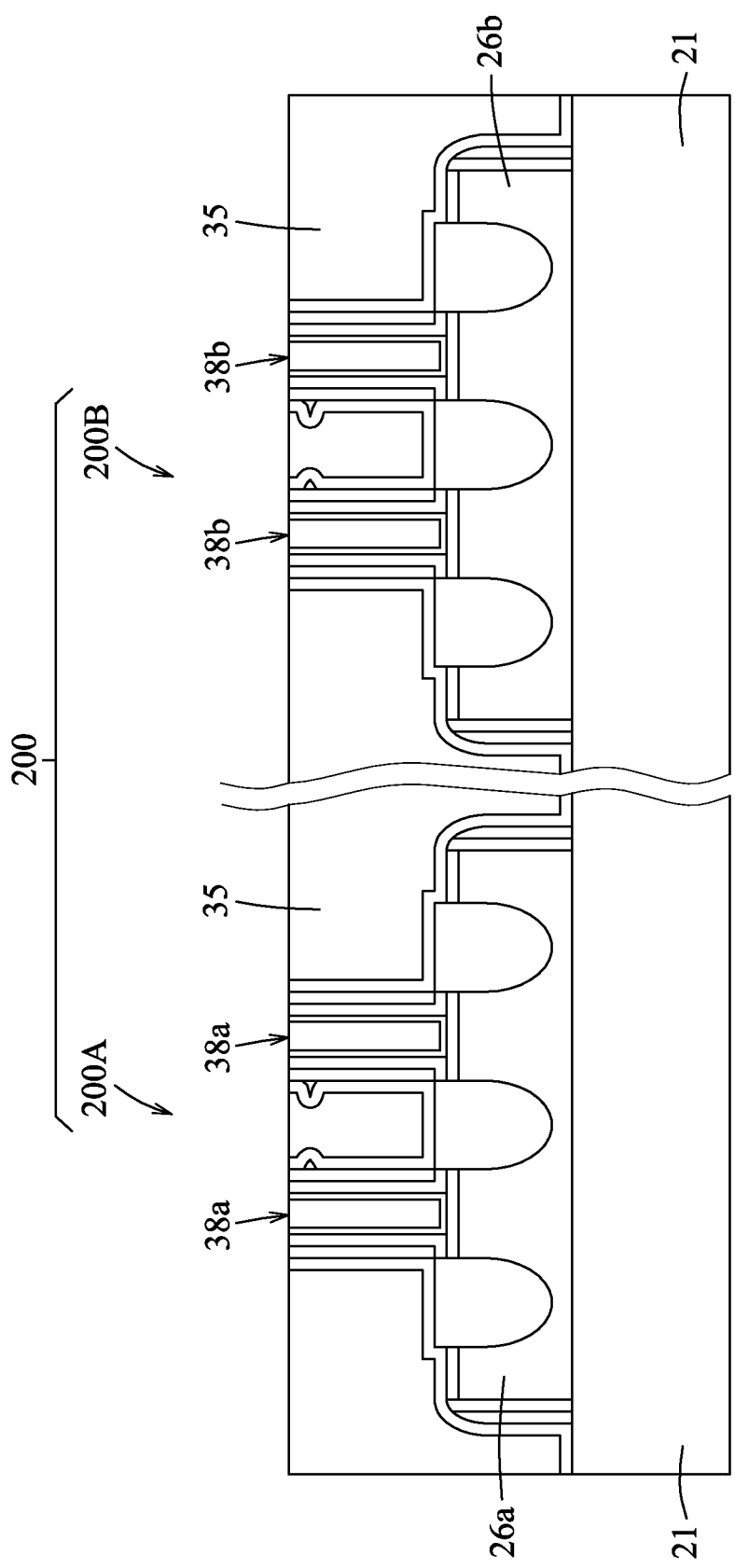

Referring to FIGS. 1B and 32, the method 100 proceeds to step 120, where a planarization process is performed to form metal gates 38a in the n-FET region 200A and to form metal gates 38b in the p-FET region 200B. Each of the metal gates 38b includes a portion of the gate dielectric layer 36a and a portion of the metal filling layer 37a shown in FIG. 29.

Each of the metal gates 38b includes a portion of the gate dielectric layer 36b and a portion of the metal filling layer 37b shown in FIG. 31. Top surfaces of the metal gates 38a, 38b are leveled with a top surface of the ILD layer 35.

Figure 33:
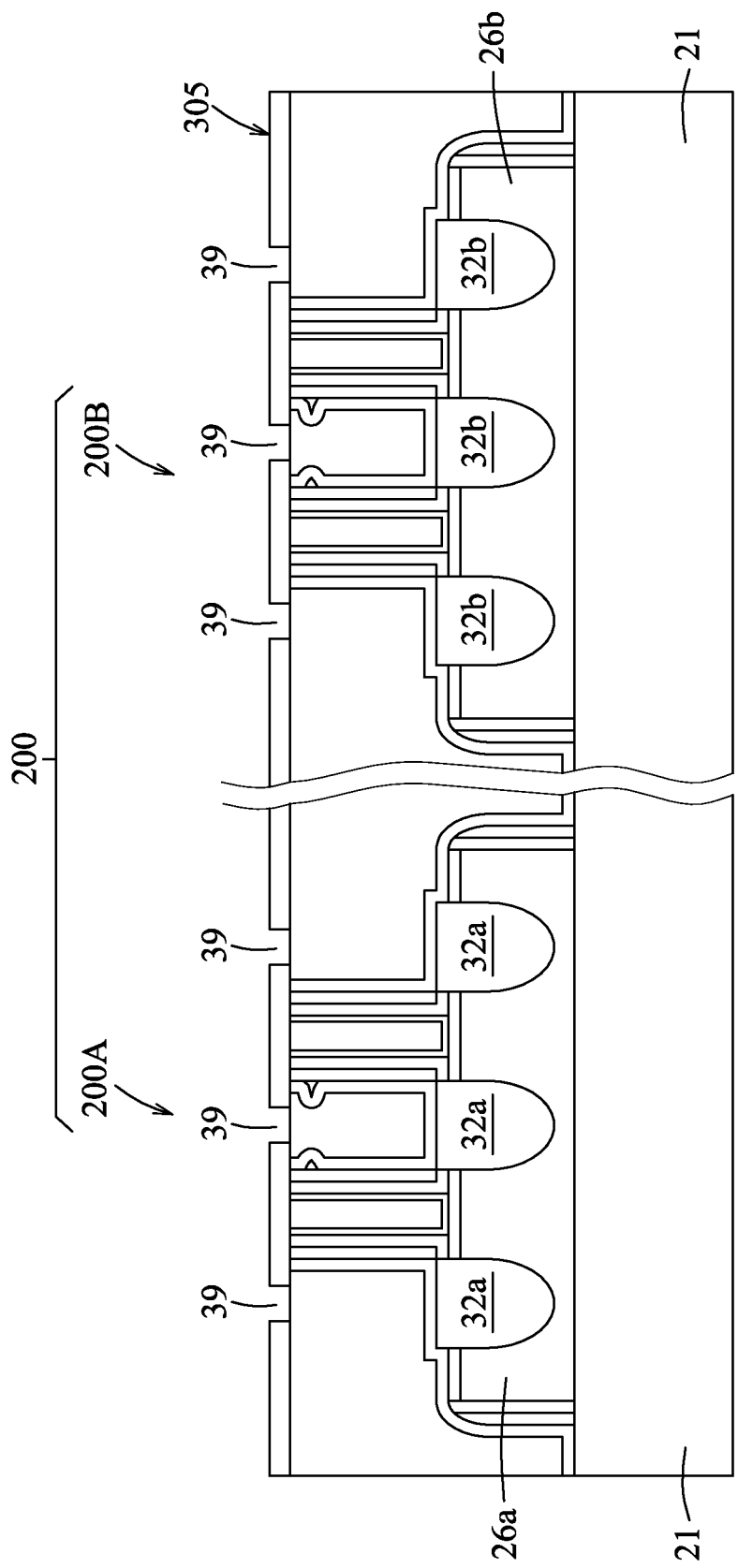

Referring to FIGS. 1B and 33, the method 100 proceeds to step 121, where a photoresist 305 is applied and patterned to cover the n-FET region 200A and the p-FET region 200B, and to have openings 39 which are located in positions corresponding to the source-drain regions 32a, 32b. In some embodiments, the patterned photoresist 305 may be replaced by a patterned hard mask.

Figure 34:
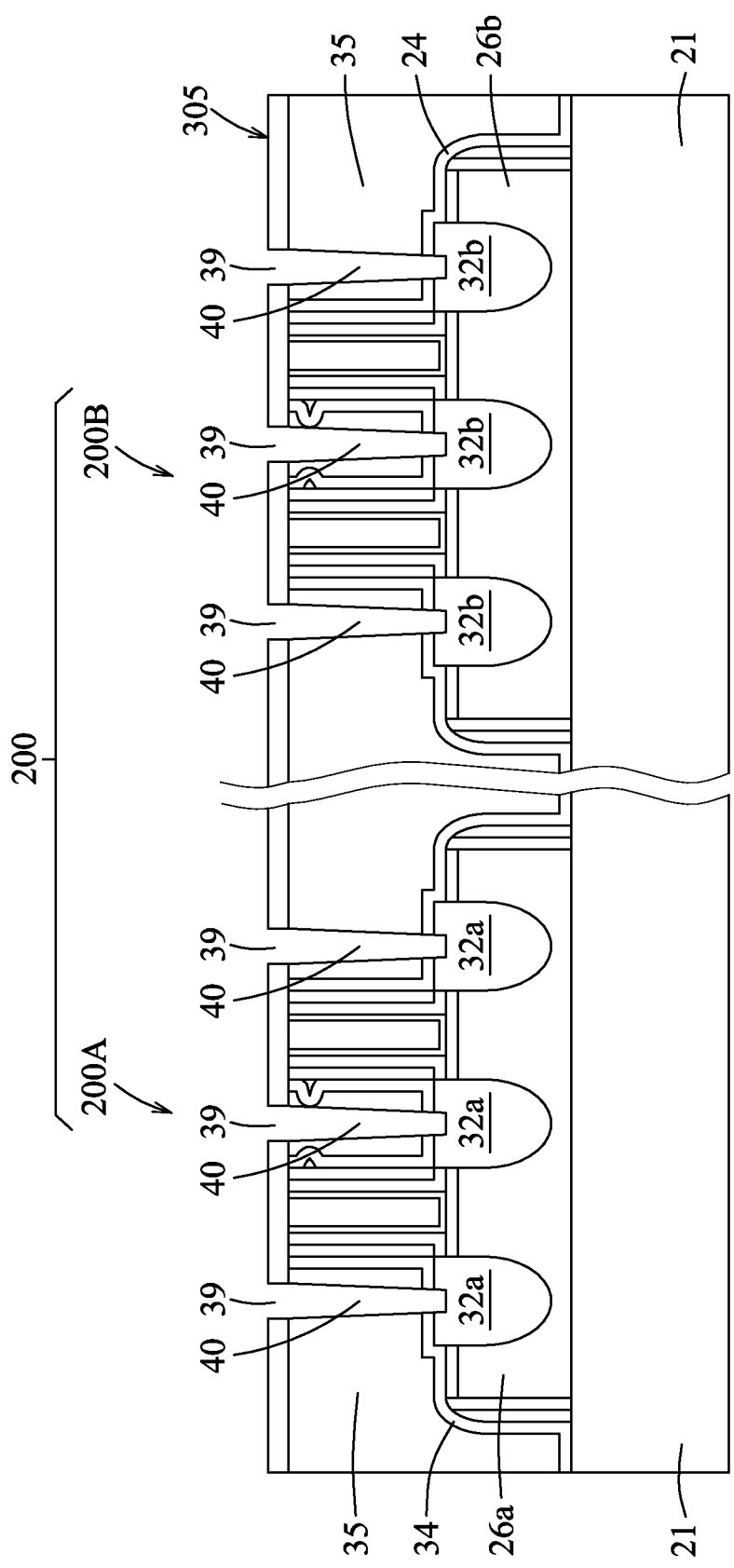

Referring to FIGS. 1B and 34, the method 100 proceeds to step 122, where a MD etching process is conducted to etch the ILD layer 35 and the CESL 34 through the openings 39 of the patterned photoresist 305 to form recesses 40. The term "MD etching" stands for a process for forming recesses for filling with metal contacts. The recesses 40 are formed to expose the source-drain regions 32a, 32b. Step 122 may be implemented using a known process in the art, such as, but not limited to, a dry etching process, a wet etching process, other suitable processes, or combinations thereof. After step 122, the patterned photoresist 305 may be removed. It should be noted that because the plasma is applied in steps 107 and 111 to remove the nodule defects 33a, 33b, the recesses 40 may be formed to access the source-drain regions 32a, 32b. In the other case that the nodule defects 33a, 33b are not at least partially removed, the presence of the amorphous nodule defects 33a, 33b may block the etching of the ILD layer 35 and the CESL 34 in step 122.

Figure 35:
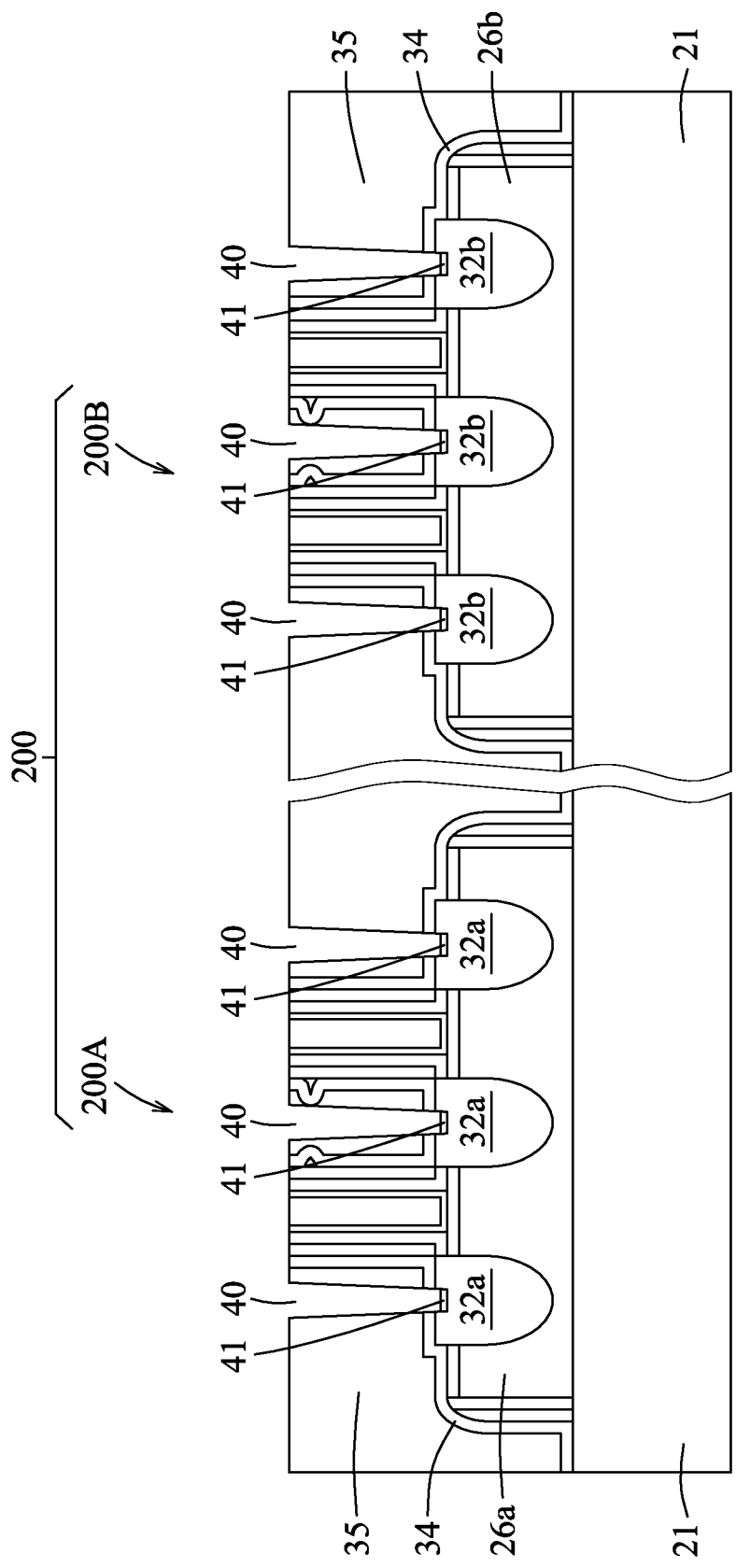

Referring to FIGS. 1B and 35, the method 100 proceeds to step 123, where silicide layers 41 are respectively formed on the exposed source-drain regions 32a, 32b exposed from the recesses 40. The silicide layers 41 may include silicon and at least one metallic element, for example, but not limited to, Al, Ti, Ta, other suitable materials, or combinations thereof.

Figure 36:
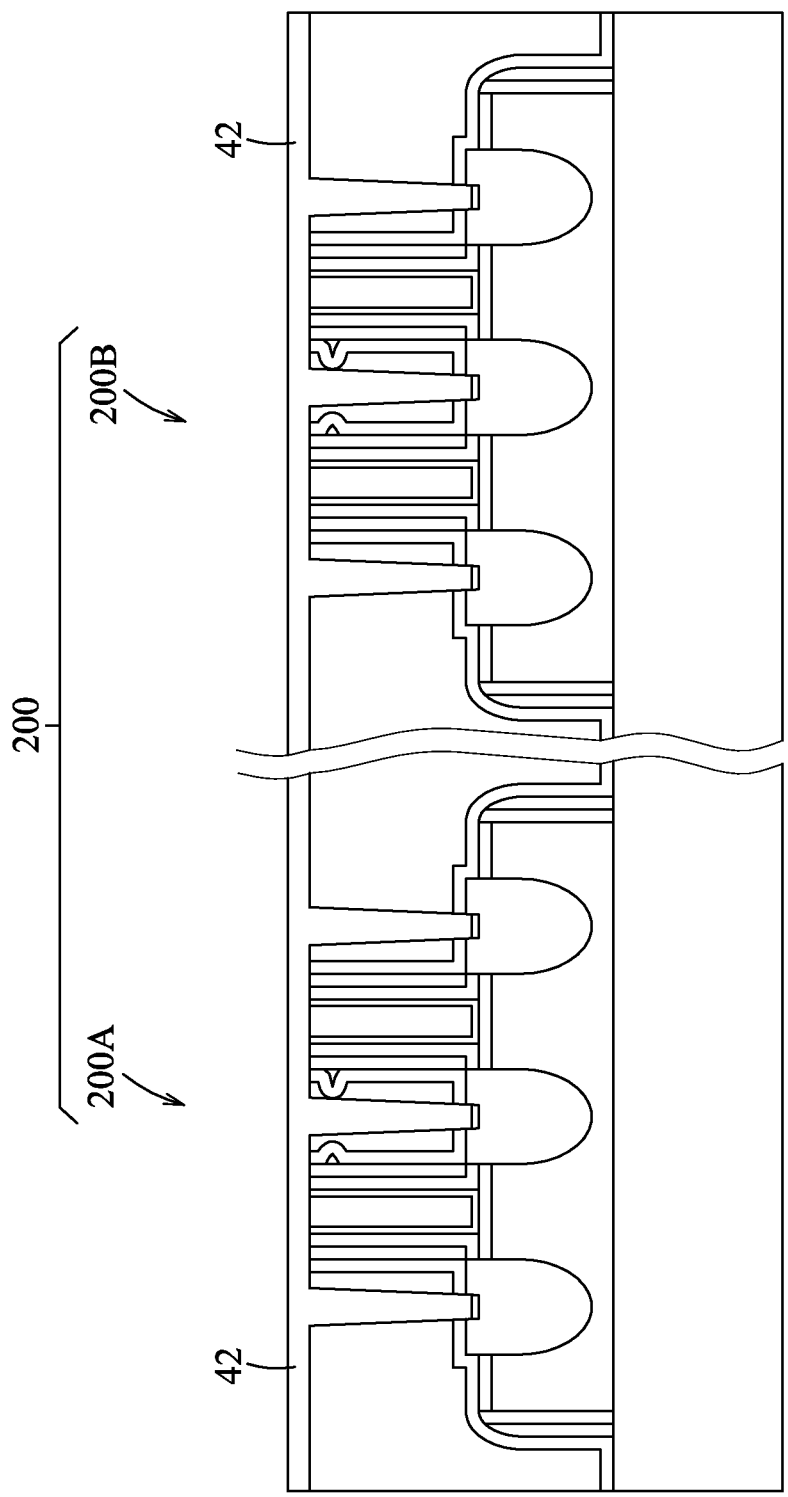

Referring to FIGS. 1B and 36, the method 100 proceeds to step 124, where a layer of metal material 42 is applied on the n-FET region 200A and the p-FET region 200B to fill in the recesses 40 shown in FIG. 35 using PVD, sputtering, other suitable methods, or combinations thereof. The metal material layer 42 may include a barrier layer (not shown) and a conductive bulk layer (not shown). The barrier layer may include Al, Ti, Ta, other suitable materials, or combinations thereof, and may be provided to prevent diffusion of the materials in the conductive bulk layer into the source-drain regions 32a, 32b. The conductive bulk layer may include a conductive material such as, but not limited to, Co, Cu, Ru, W, other suitable materials, or combinations thereof.

Figure 37:
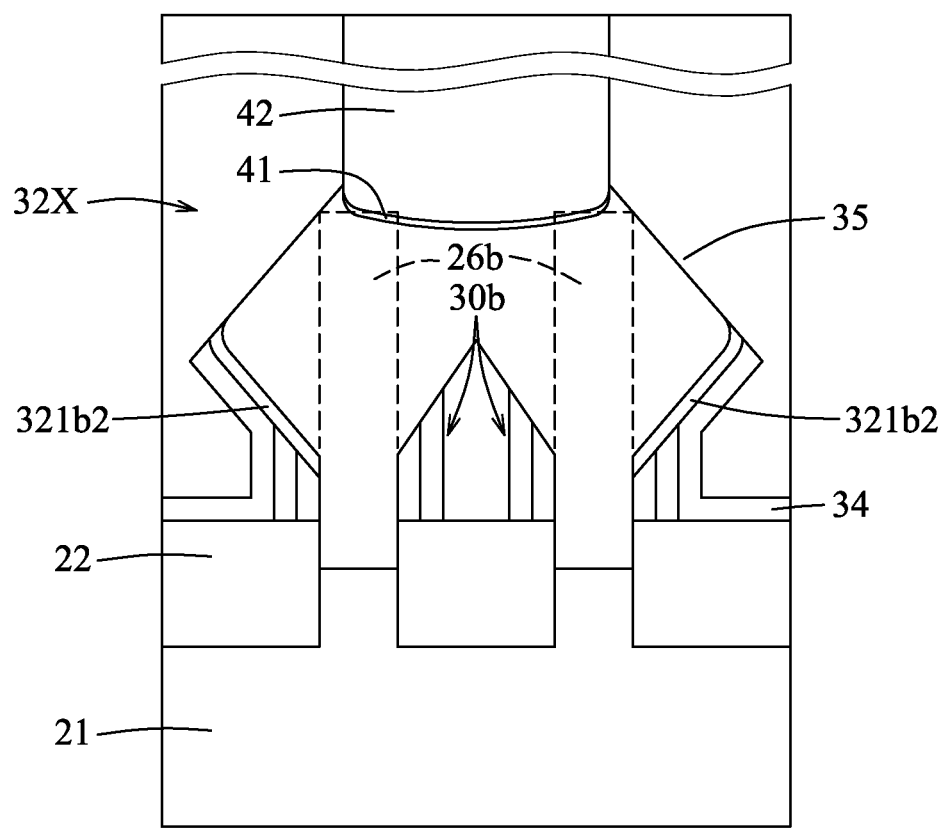

FIG. 37 is a schematic cross-sectional view similar to FIG. 22 but illustrating the intermediate state of the semiconductor fins 26b of the semiconductor structure 200 after step 124. It can be found that after steps 122 to 124, the second region 321b2 of each of the outermost sacrificial layers 321b still remains. In alternative embodiments, based on the design of the semiconductor structure, the first regions 321b1 of the each of the outermost sacrificial layers 321b (see FIG. 22) may also remain after step 123 but have a smaller thickness than the second region 321b2. In the other case that the plasma is not applied in step 111, after step 123, the outermost sacrificial layers 321b may be fully removed or the first regions 321b1 and the second regions 321b2 may have the substantially the same thickness.

Figure 38:
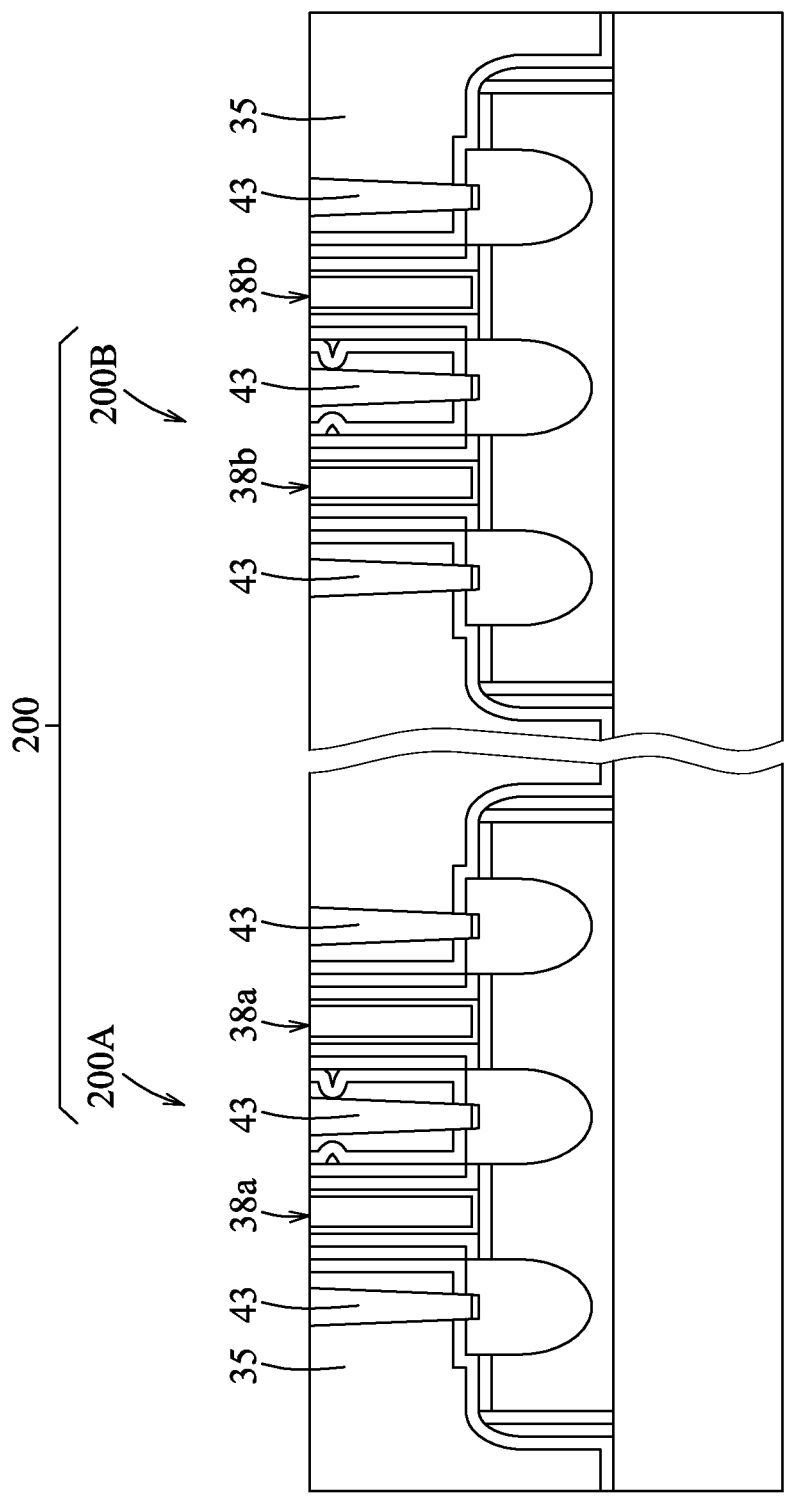

Referring to FIGS. 1B and 38, the method 100 proceeds to step 125 where a planarization process is performed to remove excess of the metal material layer 42 shown in FIG. 36 and to expose the ILD layer 35 and the top surfaces of the metal gates 38a, 38b. The step 125 may be implemented using, for example, but not limited to, chemical mechanical polishing (CMP), other suitable methods, or combinations thereof. After step 125, a plurality of metal plugs 43 are formed in the n-FET region 200A and the p-FET region 200B. In subsequent processes, each of the source-drain regions 32a, 32b may be electrically connected to an outer metal wiring (not shown) through a respective one of the metal plugs 43. The metal plugs 43 may be referred to as "metal-to-device (MD) contacts" for serving as contacts to an OD region of the semiconductor structure, for example, the source-drain regions 32a, 32b.

In alternative embodiments, additional features may be added in the semiconductor structure obtained in step 125, and some features in the semiconductor structure obtained in step 125 may be modified, replaced, or eliminated based on the design of the product to be produced.

In this disclosure, because a plasma (for example, but not limited to, a hydrogen plasma) is found to have a very high selectivity to etch the nodule defects 33a, 33b which are undesirably formed on oxide or dielectric portions during selective epitaxial processes, a yield of the semiconductor structure 200 may be enhanced. For example, in the case that the nodule defects 33a, 33b formed during formation of the source-drain regions 32a, 32b are at least partially removed, the recesses 40 may be formed to extend through the ILD layer 35 and the CESL 34 in step 122 to expose the source-drain regions 32a, 32b, thereby facilitating the formation of the metal plugs 43 for subsequent wiring processes. In addition, the plasma may also be useful in removal of nodule defects formed in other selective epitaxial processes, such as epitaxial processes for formation of an SiGe channel (or other channel materials), a silicon cap, or other possible structures.

In accordance with some embodiments of the present disclosure, a method for eliminating nodule defects is provided. The nodule defects are formed on a non-selected portion of a semiconductor structure during formation of a semiconductor region on a selected portion of the semiconductor structure. The method includes a step of applying to the semiconductor structure a plasma which has a higher selectivity to etch the nodule defects relative to the semiconductor region, to thereby eliminate the nodule defects.

In accordance with some embodiments of the present disclosure, a method for manufacturing a semiconductor structure includes steps of: forming two first recesses in two first regions of a first semiconductor portion; forming first source-drain regions in the first recesses; and applying a plasma to eliminate nodule defects formed on a dielectric portion. The plasma has a higher selectivity to etch the nodule defects relative to the first source-drain regions so as to eliminate the nodule defects.

In accordance with some embodiments of the present disclosure, a semiconductor structure includes a semiconductor substrate and a semiconductor portion. The semiconductor portion is formed on the semiconductor substrate, and has a channel region and two source-drain regions at two opposite sides of the channel region. Each of the source-drain regions has an outermost sacrificial layer. The outermost sacrificial layer includes a first region distal from the semiconductor substrate, and a second region proximate to the semiconductor substrate. A thickness of the first region is smaller than a thickness of the second region.

The foregoing outlines features of several embodiments so that those skilled in the art may better understand the aspects of the present disclosure. Those skilled in the art should appreciate that they may readily use the present disclosure as a basis for designing or modifying other processes or structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for eliminating nodule defects which are formed on a non-selected portion of a semiconductor structure during formation of a semiconductor region on a selected portion of the semiconductor structure, the method comprising
applying to the semiconductor structure a plasma which has a higher selectivity to etch the nodule defects relative to the semiconductor region, to thereby eliminate the nodule defects,
wherein the nodule defects have an amorphous phase, and the semiconductor region has a crystalline phase.

2. The method of claim 1, wherein the plasma is generated from a gas source including hydrogen.

3. The method of claim 2, wherein a flow rate of the hydrogen is controlled in a range from 10 sccm to 2000 sccm.

4. The method of claim 2, wherein the gas source further includes a carrier gas selected from helium, argon, and a combination thereof.

5. The method of claim 4, wherein a flow rate of the carrier gas is controlled in a range from 50 sccm to 6000 sccm.

6. The method of claim 1, wherein the plasma is operated under a temperature ranging from 90° C. to 600° C.

7. The method of claim 1, wherein the plasma is operated under a pressure ranging from 0.05 torr to 6 torr.

8. The method of claim 1, wherein the plasma is generated by a plasma generation source selected from a transformer-coupled plasma generator, an inductively coupled plasma system, a magnetically enhanced reactive ion etching system, an electron cyclotron resonance system, or a remote plasma generator.

9. A method for manufacturing a semiconductor structure, comprising:
forming two first recesses in two first regions of a first semiconductor portion;
forming first source-drain regions in the first recesses; and
applying a plasma to eliminate nodule defects formed on a dielectric portion, the plasma having a higher selectivity to etch the nodule defects relative to the first source-drain regions so as, to eliminate the nodule defects,
wherein the nodule defects have an amorphous phase, and the first source-drain regions have a crystalline phase.

10. The method of claim 9, after forming the first source-drain regions, further comprising:
forming two second recesses in two second regions of a second semiconductor portion; and
forming second source-drain regions in the second recesses of the second semiconductor portion.

11. The method of claim 10, wherein the nodule defects are formed in at least one of forming the first source-drain regions and forming the second source-drain regions, and the plasma has a higher selectivity to etch the nodule defects relative to the first source-drain regions and the second source-drain regions.

12. The method of claim 10, wherein the second source-drain regions have a crystalline phase.

13. The method of claim 12, wherein the plasma has a high selectivity to etch the amorphous phase relative to the crystalline phase of the first source-drain regions and the crystalline phase of the second source-drain regions.

14. The method of claim 11, wherein applying the plasma is implemented before forming the two second recesses and after forming the first source-drain regions.

15. The method of claim 11, wherein applying the plasma is implemented after forming the second source-drain regions.

16. The method of claim 11, wherein applying the plasma is implemented after each of forming the first source-drain regions and forming the second source-drain regions.

17. The method of claim 9, wherein the plasma is generated from a gas source including hydrogen.

18. The method of claim 9,
wherein the first semiconductor portion is located on a semiconductor substrate;
wherein, after forming the first source-drain regions, each of the first source-drain regions has an outermost sacrificial layer which includes a first region distal from the semiconductor substrate, and a second region proximate to the semiconductor substrate; and
wherein, after applying the plasma, a thickness of the first region is smaller than a thickness of the second region.

19. A semiconductor structure comprising:
a semiconductor substrate; and
a semiconductor portion formed on the semiconductor substrate, and having a channel region and two source-drain regions at two opposite sides of the channel region, each of the source-drain regions having an outermost sacrificial layer, the outermost sacrificial layer including a first region, and a second region, a thickness of the first region being smaller than a thickness of the second region,
wherein the first region is orientated to face away from the semiconductor substrate, and the second region is orientated to face toward the semiconductor substrate; and
wherein the first region and the second region are interconnected to each other at a corner.

20. The semiconductor structure of claim 19, wherein each of the source-drain regions has a diamond-like shape structure with the corner which is rounded.

* * * * *